(12) United States Patent
Ichinohe et al.

(10) Patent No.: US 11,393,778 B2
(45) Date of Patent: Jul. 19, 2022

(54) SEMICONDUCTOR DEVICE AND ANTENNA DEVICE

(71) Applicant: Mitsubishi Electric Corporation, Tokyo (JP)

(72) Inventors: Hiroaki Ichinohe, Tokyo (JP); Akihiro Matsusue, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 17/278,871

(22) PCT Filed: Dec. 5, 2018

(86) PCT No.: PCT/JP2018/044670
§ 371 (c)(1),
(2) Date: Mar. 23, 2021

(87) PCT Pub. No.: WO2020/115830
PCT Pub. Date: Jun. 11, 2020

(65) Prior Publication Data
US 2022/0051997 A1     Feb. 17, 2022

(51) Int. Cl.
*H01L 23/66* (2006.01)
*H01L 23/31* (2006.01)
(Continued)

(52) U.S. Cl.
CPC .......... *H01L 23/66* (2013.01); *H01L 23/3107* (2013.01); *H01L 23/49503* (2013.01);
(Continued)

(58) Field of Classification Search
CPC .................. H01L 23/66; H01L 23/3107; H01L 23/49503; H01L 24/48
See application file for complete search history.

(56) References Cited

U.S. PATENT DOCUMENTS

2015/0187671 A1* 7/2015 Fukuda ............ H01L 23/49541
257/773
2017/0278763 A1* 9/2017 Li ........................ H01L 24/29

FOREIGN PATENT DOCUMENTS

JP     H06-97359 A     4/1994
JP     H10-173117 A    6/1998
(Continued)

OTHER PUBLICATIONS

International Search Report issued in PCT/JP2018/044670; dated Mar. 5, 2019.

*Primary Examiner* — Marc Anthony Armand
(74) *Attorney, Agent, or Firm* — Studebaker & Brackett PC

(57) ABSTRACT

A semiconductor device according to the present invention includes: a semiconductor element; a first metal body having a die pad to which the semiconductor element is mounted, the semiconductor element being mounted on a die bond surface of the die pad; a second metal body which has a wire bond pad connected to a signal electrode of the semiconductor element via a wire, and is provided on the same side as the die bond surface such that the second metal body is separated from the first metal body and covered by the first metal body, the second metal body forming a transmission line together with the first metal body; and a molding resin holding the first metal body and the second metal body such that a surface of the first metal body opposite to the die bond surface is exposed.

20 Claims, 20 Drawing Sheets

(51) Int. Cl.
*H01L 23/495* (2006.01)
*H01L 23/00* (2006.01)

(52) U.S. Cl.
CPC ...... *H01L 24/48* (2013.01); *H01L 2223/6627* (2013.01); *H01L 2224/48245* (2013.01)

(56) References Cited

FOREIGN PATENT DOCUMENTS

| | | | |
|---|---|---|---|
| JP | 2015-211056 | A | 11/2015 |
| JP | 2017-208377 | A | 11/2017 |

* cited by examiner

SEMICONDUCTOR DEVICE AND ANTENNA DEVICE

TECHNICAL FIELD

The present invention relates to a semiconductor device used at a high frequency and an antenna device using the same.

BACKGROUND ART

In these days, a 5th-generation mobile communication system is being studied and developed for realizing a higher-speed and larger-capacity wireless communication service. For realizing this, broadening of the signal bandwidth using a frequency band (3.5 to 6 GHz, 28 GHz, etc.) higher than the existing frequency band, and application of massive multiple-input multiple-output (MIMO) technology in which an antenna with an extremely large number of elements and MIMO are combined, are being considered.

As an antenna with an extremely large number of elements, it is assumed that a plurality of planar antennas whose number is more than 100 are arranged in an array form at intervals of about half the wavelength on a surface of a circuit substrate. Here, in order to minimize transmission loss when transmitting/receiving power with the antenna, it is desirable to provide a semiconductor device such that a transmission path length between the semiconductor device and the antenna is minimized. In the case where the antenna interval is ½ of the wavelength, for example, the antenna interval is 2.5 cm for 6 GHz and 0.53 cm for 28 GHz. Thus, there is little space for providing the semiconductor device on the antenna surface. Therefore, the semiconductor device is surface-mounted in the vicinity of the direct back side of the antenna, on the top surface of the circuit substrate on the back surface side of the antenna surface.

While the semiconductor device needs to dissipate heat generated through operation thereof, the antenna surface side and the top surface side of the circuit substrate both have little space for providing a heatsink in the vicinity of the semiconductor device. However, in the case where a heatsink is provided away from the antenna and the semiconductor device and heat is dissipated through the substrate, the heat dissipation path is elongated and the thermal resistance as seen from the semiconductor device is increased, thus having a disadvantage in increasing the output of the semiconductor device.

Regarding this problem, disclosed is a configuration in which, as well as dissipating heat through a mounting substrate on which a semiconductor device is surface-mounted, a die pad portion of the semiconductor device is provided so as to be exposed on a surface opposed to the mounting substrate so that heat is dissipated from the exposed part, whereby heat dissipation is improved (for example, Japanese Laid-Open Patent Publication No. 2017-208377).

CITATION LIST

Patent Document

Patent Document 1: Japanese Laid-Open Patent Publication No. 2017-208377

SUMMARY OF THE INVENTION

Problems to be Solved by the Invention

However, the semiconductor device disclosed in Patent Document 1 does not have an electromagnetic shield function. Therefore, if the semiconductor devices are arranged closely to each other as in the antenna with an extremely large number of elements, electromagnetic waves radiated from input/output signal terminals of the semiconductor device are coupled with input/output signals of another semiconductor device, leading to a problem of causing oscillation and deteriorating propagation property at a high frequency.

The present invention has been made to solve the above problem, and an object of the present invention is to provide a semiconductor device and an antenna device that not only improve heat dissipation but also inhibit oscillation due to coupling between semiconductor devices and deterioration of propagation property at a high frequency even in the case where a plurality of semiconductor devices are arranged closely to each other.

Solution to the Problems

A semiconductor device according to the present invention includes: a semiconductor element; a first metal body having a die pad portion to which the semiconductor element is mounted, the semiconductor element being mounted on a die bond surface of the die pad portion; a second metal body which has a wire bond pad portion connected to a signal electrode of the semiconductor element via a wire, and is provided on a same side as the die bond surface of the first metal body on which the semiconductor element is mounted, such that the second metal body is separated from the first metal body and covered by the first metal body, the second metal body forming a transmission line together with the first metal body; and a molding resin holding the first metal body and the second metal body such that a surface of the first metal body opposite to the die bond surface on which the semiconductor element is mounted is exposed, wherein the exposed surface of the first metal body protrudes by a predetermined amount from an outer shape of the molding resin.

An antenna device according to the present invention includes: a plurality of semiconductor devices; a substrate to which the plurality of semiconductor devices are mounted; and a plurality of antennas mounted on a surface opposite to a surface on which the plurality of semiconductor devices are mounted, the plurality of semiconductor devices each including: a semiconductor element; a first metal body having a die pad portion to which the semiconductor element is mounted, the semiconductor element being mounted on a die bond surface of the die pad portion; a second metal body which has a wire bond pad portion connected to a signal electrode of the semiconductor element via a wire, and is provided on a same side as the die bond surface of the first metal body on which the semiconductor element is mounted, such that the second metal body is separated from the first metal body and covered by the first metal body, the second metal body forming a transmission line together with the first metal body; and a molding resin holding the first metal body and the second metal body such that a surface of the first metal body opposite to the die bond surface on which the semiconductor element is mounted is exposed, wherein the exposed surface of the first metal body protrudes by a predetermined amount from an outer shape of the molding resin.

Effect of the Invention

The semiconductor device and the antenna device configured as described above make it possible to not only improve heat dissipation but also inhibit oscillation due to coupling between semiconductor devices and deterioration of propagation property at a high frequency even in the case where a plurality of semiconductor devices are arranged closely to each other.

DESCRIPTION OF EMBODIMENTS

Embodiment 1

Figure 1A:
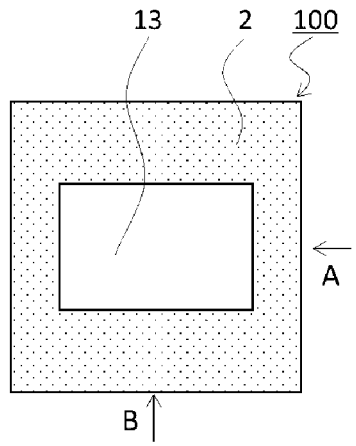
FIGS. 1A to 1D illustrate a plan view, a side view, a front view, and a bottom view of a semiconductor device according to embodiment 1 of the present invention.

A semiconductor device according to embodiment 1 of the present invention will be described with reference to FIGS. 1 to 6. In the drawings, the same reference characters denote the same or corresponding parts, and this applies in the entirety of the specification. Hereinafter, with reference to the drawings, embodiments of the present invention will be described.

Figure 1B:
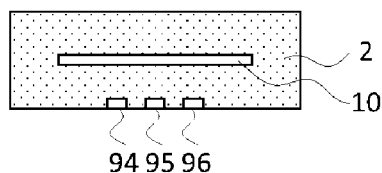
Figure 1C:
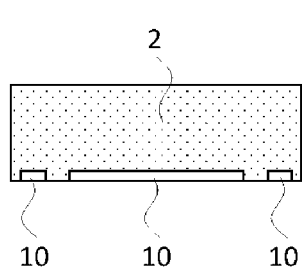
Figure 1D:
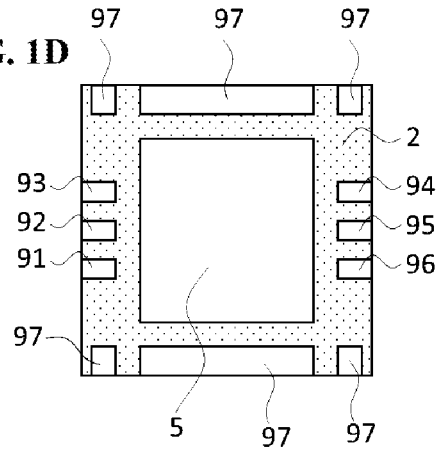

FIGS. 1A to 1D are a plan view, a side view, a front view, and a bottom view of a semiconductor device 100 according to embodiment 1. FIG. 1A is a plan view of the semiconductor device 100 as seen from the top, FIG. 1B is a side view of the semiconductor device 100 as seen from the direction of arrow A, FIG. 1C is a front view of the semiconductor device 100 as seen from the direction of arrow B, and FIG. 1D is a bottom view of the semiconductor device 100 as seen from the bottom.

As shown in FIG. 1A, on the top surface of the semiconductor device 100, a heat dissipation surface 13 of a first metal body 10 is exposed from a molding resin 2. As shown in FIG. 1B, on the side surface of the semiconductor device 100 as seen from the direction of arrow A in FIG. 1A, signal terminals 94, 95, 96 and the first metal body 10 are exposed from the molding resin 2. As shown in FIG. 1C, the first metal body 10 is exposed on the front surface of the semiconductor device 100 as seen from the direction of arrow B in FIG. 1A. As shown in FIG. 1D, the bottom surface of the semiconductor device 100 is sealed by a cap 5. Signal terminals 91, 92, 93, 94, 95, 96 and ground terminals 97 are provided at the bottom surface of the semiconductor device 100 so as to be exposed from the molding resin 2.

Figure 2A:
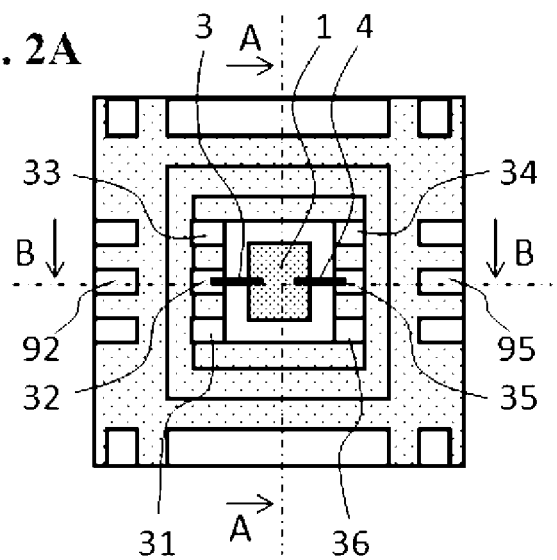
FIGS. 2A to 2C illustrate a bottom view and sectional views showing the internal structure of the semiconductor device according to embodiment 1 of the present invention.
Figure 2B:
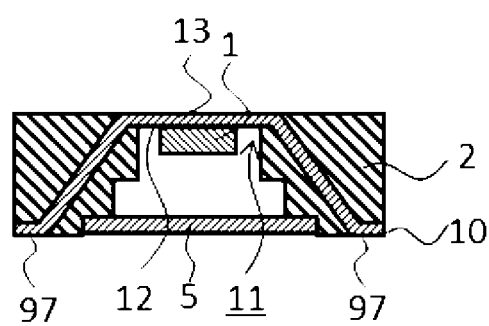
Figure 2C:
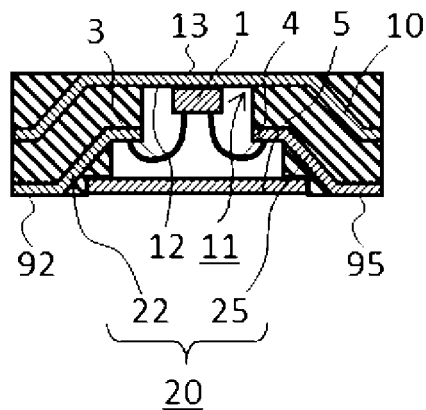

FIGS. 2A to 2C are a bottom view, a sectional view along line A-A, and a sectional view along line B-B showing the internal structure of the semiconductor device 100 according to embodiment 1 of the present invention. FIG. 2A is a bottom view of the semiconductor device 100 as seen from the bottom, FIG. 2B is a sectional view of the semiconductor device 100 along line A-A in FIG. 2A, and FIG. 2C is a sectional view of the semiconductor device 100 along line B-B in FIG. 2A. The cap 5 is shown in FIG. 2B and FIG. 2C, but the cap 5 is not shown in FIG. 2A.

As shown in FIGS. 2A to 2C, a cavity is provided inside the semiconductor device 100. A flat portion of the first metal body 10 exposed in the cavity is defined as a die pad portion 11. A semiconductor element 1 is mounted to the die pad portion 11. In the cavity, wire bond pad portions 32, 35 which are parts of signal leads 22, 25 are exposed, and the semiconductor element 1 and the wire bond pad portions 32, 35 can be connected via wires 3, 4.

The signal lead 22 and the signal lead 25 are second metal bodies 20. The first metal body 10 and the second metal bodies 20 may be made of the same material or may be made of different materials.

On the inner side of the semiconductor device 100, a surface of the die pad portion 11 of the first metal body 10 on which the semiconductor element 1 is mounted is defined as a die bond surface 12, and on the outer side of the semiconductor device 100, a surface on the back side of the die bond surface 12 is defined as a heat dissipation surface 13. The molding resin 2 is formed so as not to coat the first metal body 10 at the die bond surface 12 and the heat dissipation surface 13. That is, the die bond surface 12 and the heat dissipation surface 13 of the first metal body 10 are exposed.

In embodiment 1, the semiconductor element 1 mounted in the semiconductor device 100 is a field effect transistor using gallium nitride (GaN) as a material thereof. On the top surface of the semiconductor element 1, a signal electrode (not shown) which is connected to the gate of the field effect transistor and can be wire-bonded, is provided. In addition, on the top surface of the semiconductor element 1, a signal electrode (not shown) which is connected to the drain of the field effect transistor and can be wire-bonded, is provided.

The signal lead 22 is provided, so as to be separated from the first metal body 10, on the same side as the surface of the first metal body 10 on which the semiconductor element 1 is mounted. The signal lead 22 has the wire bond pad portion 32. The signal electrode connected to the gate of the semiconductor element 1 is connected to the wire bond pad portion 32 via the wire 3. An exposed part of the signal lead 22 on the back surface of the semiconductor device 100 forms the signal terminal 92 of the semiconductor device 100.

The signal lead 25 is provided, so as to be separated from the first metal body 10, on the same side as the surface of the first metal body 10 on which the semiconductor element 1 is mounted. The signal lead 25 has the wire bond pad portion 35. The signal electrode connected to the drain of the semiconductor element 1 is connected to the wire bond pad portion 35 via the wire 4. An exposed part of the signal lead 25 on the back surface of the semiconductor device 100 forms the signal terminal 95 of the semiconductor device 100.

A ground electrode of the semiconductor element 1 is a metal film (not shown) provided over the entirety of the back surface of the semiconductor element 1. The ground electrode of the semiconductor element 1 is connected to the source of the field effect transistor via a via-hole. The ground electrode of the semiconductor element 1 is die-bonded and fixed to the die bond surface 12. A die-bonding material (not shown) is Ag paste resin, solder, sintered silver, or the like, having conductivity. The ground electrode of the semiconductor element 1 is conductive to the first metal body 10 via the die-bonding material.

In embodiment 1, the semiconductor element 1 is a field effect transistor. However, the semiconductor element 1 may be a bipolar transistor, an integrated circuit (IC), a large scale integration (LSI), a microwave monolithic integrated circuit (MMIC), or the like. The semiconductor element 1 may have one or a plurality of signal electrodes, and may have one or a plurality of bias electrodes. The ground electrode of the semiconductor element 1 is the metal film provided on the back surface. However, the ground electrode may be provided on the top surface of the semiconductor element 1, and the ground electrode and the first metal body 10 may be connected via a wire so as to be conductive to each other.

The material of the semiconductor element 1 may be gallium arsenide (GaAs), silicon (Si), or the like. A plurality of semiconductor elements 1 may be mounted in the semiconductor device 100.

The molding resin 2 coats a part of the first metal body 10, and a part of the signal lead 22 and a part of the signal lead 25 which are the second metal bodies 20, and holds the first metal body 10 and the second metal bodies 20 in a state of being separated from each other. On the other hand, the die pad portion 11, the semiconductor element 1, the wire 3, the wire 4, and wire bond pad portions 31, 32, 33, 34, 35, 36 are not coated with the molding resin 2. That is, in the semiconductor device 100, the molding resin 2, the first metal body 10, and the second metal bodies 20 form a package with a hollow structure.

The molding resin 2 is formed such that an outer shape thereof is flush with the heat dissipation surface 13 and the heat dissipation surface 13 is exposed, so as to allow the heat dissipation surface 13 to be in contact with a heatsink.

The molding resin 2 may be a thermosetting resin formed by using epoxy resin as matrix resin and using mainly a silica filler as a filler material, for example. In such a case, in general, 70 to 90 wt % of silica is contained as a filler material, and the relative permittivity is approximately 3.5 to 4.0.

The cap 5 seals the opening provided at the back surface of the semiconductor device 100, to protect the semiconductor element 1, the wire 3, and the like from an outer atmosphere including chemical substances, water vapor, dust, or a physical external force, etc. The cap 5 is formed by a method such as transfer molding using a thermosetting resin as a material thereof.

The cap 5 is adhered to the molding resin 2 of the semiconductor device 100 by an adhesive agent (not shown). The adhesive agent is an epoxy-based adhesive resin such as bisphenol A or F. The adhesive agent is applied to the cap 5 or the molding resin 2, and the cap 5 and the molding resin 2 are brought into close contact with each other at a predetermined position. Thereafter, the adhesive agent is thermally cured so that the cap 5 and the molding resin 2 are fixed to each other.

In embodiment 1, the semiconductor device 100 is sealed by the cap 5 so that the semiconductor element 1, the wire 3, and the like are protected from an outer atmosphere including chemical substances, water vapor, dust, or a physical external force, etc. However, for example, without using the cap 5, resin may be potted to the semiconductor element 1, the wire 3, and the like.

Figure 3A:
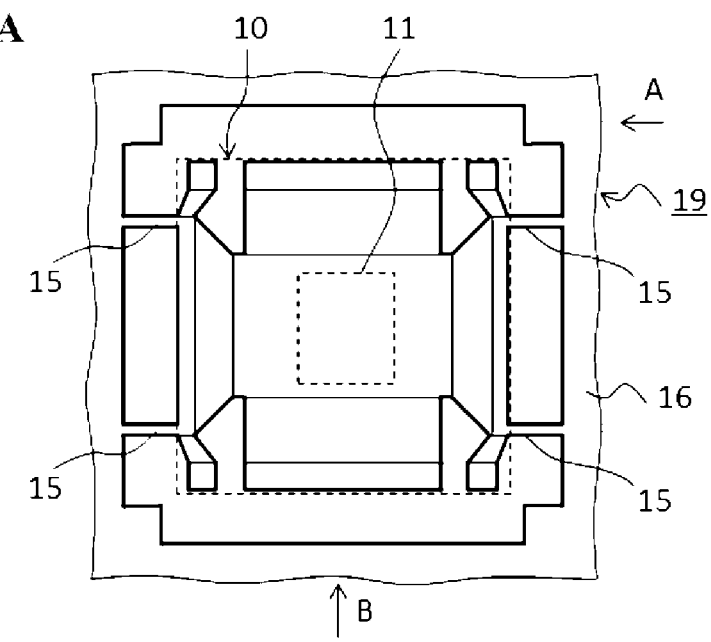
FIGS. 3A to 3C illustrate a plan view, a side view, and a front view of a lead frame including a first metal body, used in the semiconductor device according to embodiment 1 of the present invention.
Figure 3B:
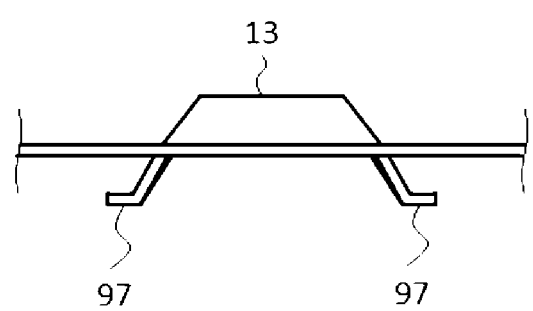
Figure 3C:
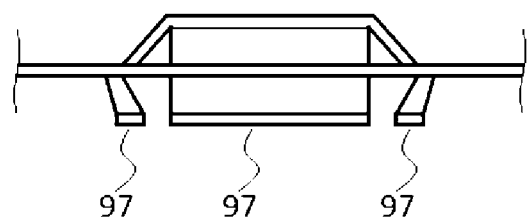

FIGS. 3A to 3C are a plan view, a side view, and a front view of a lead frame 19 including the first metal body, used in the semiconductor device 100 according to embodiment 1. FIG. 3A is a plan view of the lead frame 19 as seen from the top, FIG. 3B is a side view of the lead frame 19 as seen from the direction of arrow A in FIG. 3A, and FIG. 3C is a front view of the lead frame 19 as seen from the direction of arrow B in FIG. 3A.

FIGS. 3A to 3C show the lead frame 19 before the semiconductor device 100 is formed. The lead frame 19 is formed from a metal sheet of copper, a copper alloy, or the like as a material thereof. The thickness of the lead frame 19 can be set to, for example, 0.2 to 0.5 mm.

As shown in FIGS. 3A to 3C, the lead frame 19 includes the first metal body 10, a plurality of suspension leads 15, and a tie bar 16. The suspension leads 15 are connected to the first metal body 10 and the tie bar 16. The die pad portion 11 and the ground terminals 97 of the semiconductor device 100 are parts of the first metal body 10, and the die pad portion 11 and the ground terminals 97 are conductive to each other.

Figure 4A:
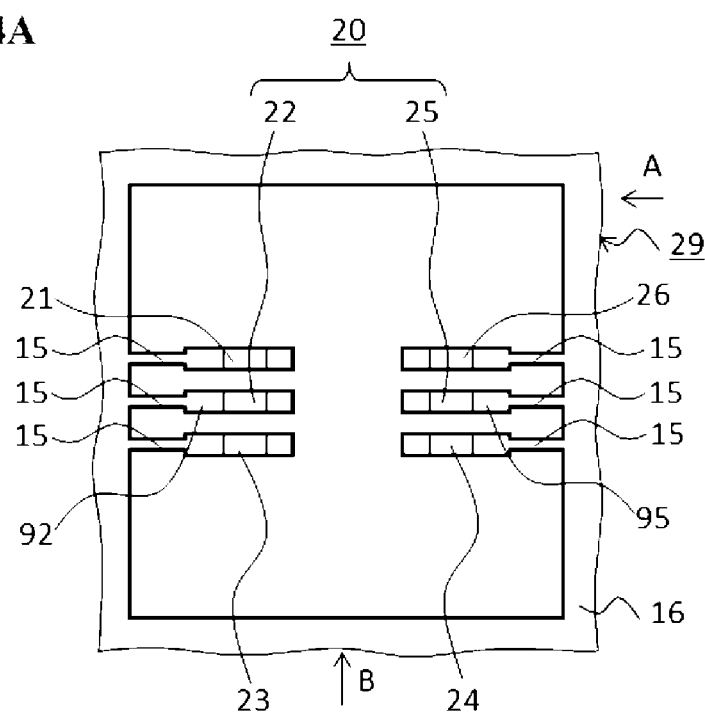
FIGS. 4A to 4C illustrate a plan view, a side view, and a front view of a lead frame including a second metal body, used in the semiconductor device according to embodiment 1 of the present invention.
Figure 4B:
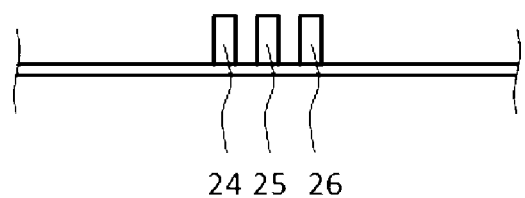
Figure 4C:
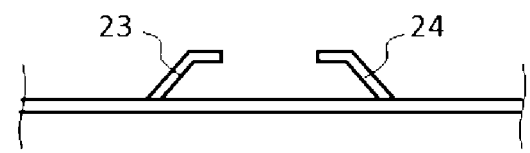

FIGS. 4A to 4C are a plan view, a side view, and a front view of a lead frame 29 including the second metal bodies, used in the semiconductor device 100 according to embodiment 1. FIG. 4A is a plan view of the lead frame 29 as seen from the top, FIG. 4B is a side view of the lead frame 29 as seen from the direction of arrow A in FIG. 4A, and FIG. 4C is a front view of the lead frame 29 as seen from the direction of arrow B in FIG. 4A.

FIGS. 4A to 4C show the lead frame 29 before the semiconductor device 100 is formed. As with the lead frame 19, the lead frame 29 is formed from a metal sheet of copper, a copper alloy, or the like as a material thereof. The thickness of the lead frame 29 can be set to, for example, 0.2 to 0.5 mm. The lead frame 29 includes signal leads 21, 22, 23, 24, 25, 26 composing the semiconductor device 100, a plurality of suspension leads 15, and a tie bar 16.

Figure 5A:
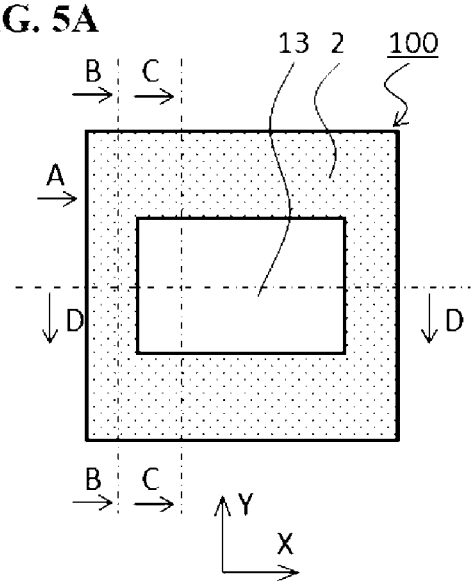
FIGS. 5A to 5E illustrate the semiconductor device according to embodiment 1 of the present invention.
Figure 5C:
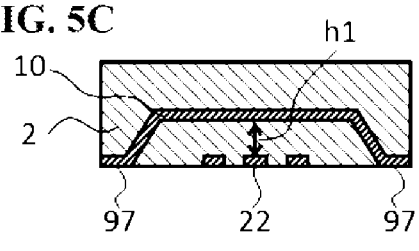
Figure 5D:
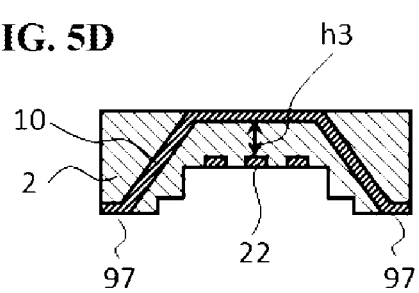
Figure 5B:
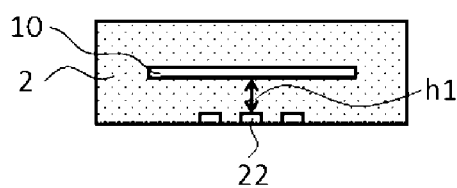
Figure 5E:
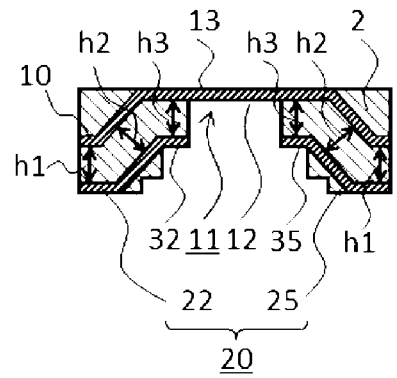

FIGS. 5A to 5E illustrate the first metal body 10, the second metal bodies 20, and the molding resin 2 of the semiconductor device 100 according to embodiment 1, while other parts are not shown, as appropriate. FIG. 5A is a plan view of the semiconductor device 100 as seen from the top, FIG. 5B is a side view of the semiconductor device 100 as seen from the direction of arrow A in FIG. 5A, FIG. 5C is a sectional view of the semiconductor device 100 along line B-B in FIG. 5A, FIG. 5D is a sectional view of the semiconductor device 100 along line C-C in FIG. 5A, and FIG. 5E is a sectional view of the semiconductor device 100 along line D-D in FIG. 5A.

In FIG. 5B, FIG. 5C, and FIG. 5D, the signal lead 22 and the first metal body 10 are provided so as to be separated from each other with the dielectric molding resin 2 interposed therebetween, thus forming a microstrip line which is one type of transmission line.

In order that the characteristic impedance of the microstrip line becomes constant, it is desirable that the width and the thickness of the signal lead 22 and the interval between the signal lead 22 and the first metal body 10 are almost constant over the entire range of the signal lead 22.

The signal lead 22 and the first metal body 10 are provided such that intervals h1, h2, h3 at parts where the signal lead 22 and the first metal body 10 are parallel to each other are constant.

For example, the signal lead 22 has a width of 0.34 mm and a thickness of 0.2 mm, the intervals h1, h2, h3 between the signal lead 22 and the first metal body 10 are 0.2 mm, and the relative permittivity of the molding resin 2 is 3.6, so that the characteristic impedance at a frequency of 28 GHz is 50Ω.

However, the interval between the signal lead 22 and the first metal body 10 is not necessarily constant over the entire range of the signal lead 22. For example, as shown in FIG. 5E, the signal lead 22 and the first metal body 10 are bent, so that the interval between the signal lead 22 and the first metal body 10 at bent parts is different from the interval between the signal lead 22 and the first metal body 10 at parallel parts. In addition, due to restriction, tolerance, and the like in manufacturing, the interval between the signal lead 22 and the first metal body 10 might not be constant.

TABLE 1

| Interval between signal lead 22 and first metal body 10 (mm) | 0.16 | 0.18 | 0.19 | 0.20 | 0.21 | 0.22 | 0.24 |
|---|---|---|---|---|---|---|---|
| Relative value with respect to design value | 0.80 | 0.90 | 0.95 | 1.00 | 1.05 | 1.10 | 1.20 |
| Return loss (dB) | 23.5 | 30.2 | 36.5 | +∞ | 37.0 | 31.2 | 25.7 |

Table 1 shows return loss in the case where the interval between the signal lead 22 which is the second metal body 20 and the first metal body 10 is changed. The interval between the signal lead 22 and the first metal body 10 in embodiment 1 is set at a design value of 0.2 mm. Even in the case where the width and the thickness of the signal lead 22 and the interval between the signal lead 22 and the first metal body 10 cannot be made perfectly constant due to working constraint, tolerance, and the like in manufacturing, for example, if the interval between the signal lead 22 and the first metal body 10 is set in a range of 0.18 mm to 0.22 mm, return loss due to variation in the characteristic impedance becomes 30 dB or greater, whereby favorable characteristics can be obtained.

This corresponds to a range in which a value obtained by dividing the interval between the signal lead 22 and the first metal body 10 by the design value of 0.2 mm, i.e., a relative value with respect to the design value, is 0.90 to 1.10. That is, for the interval between the signal lead 22 and the first metal body 10, a tolerance in a range of ±10% with respect to the design value is permissible.

Similarly, the signal lead 25 which is the second metal body 20 and the first metal body 10 form a microstrip line. For example, the signal lead 25 has a width of 0.34 mm and a thickness of 0.2 mm, intervals h1, h2, h3 between the signal lead 25 and the first metal body 10 are 0.2 mm, and the relative permittivity of the molding resin 2 is 3.6, so that the characteristic impedance at a frequency of 28 GHz is 50Ω. It is desirable that such a configuration is almost constant over the entire range of the signal lead 25.

Depending on the designing of the semiconductor device 100, the characteristic impedances of the microstrip lines formed by the signal leads 22, 25 and the first metal body 10 may be set to be other than 50Ω, and thus the microstrip lines formed by the signal leads 22, 25 and the first metal body 10 may be used as matching elements.

Figure 6A:
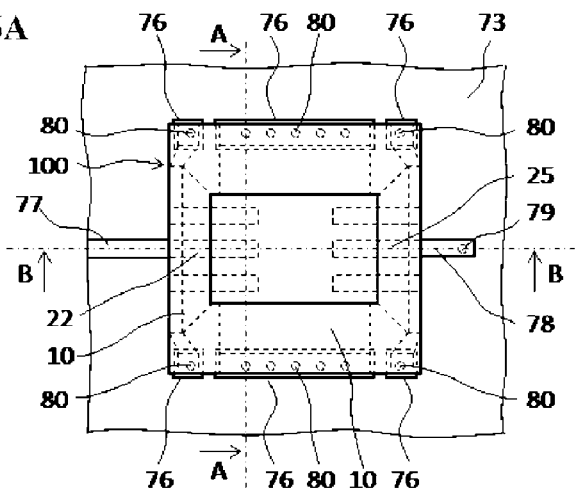
FIGS. 6A to 6C illustrate schematic views of an electronic apparatus to which the semiconductor device according to embodiment 1 of the present invention is mounted.
Figure 6B:
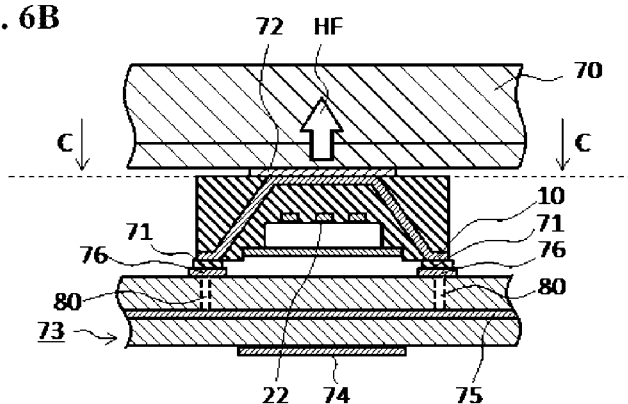
Figure 6C:
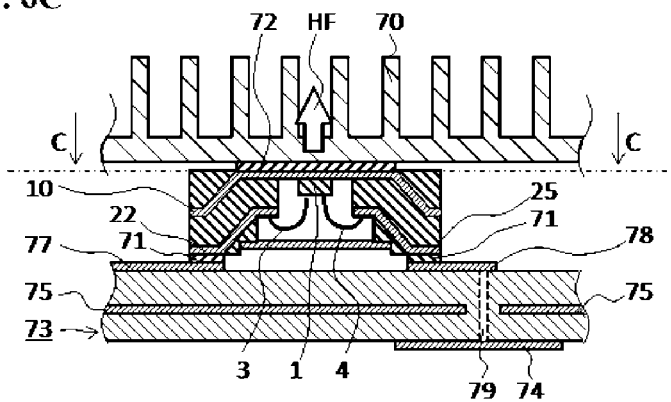

FIGS. 6A to 6C are schematic views of an electronic apparatus to which the semiconductor device 100 according to embodiment 1 is mounted. FIG. 6A is a schematic plan view of the electronic apparatus to which the semiconductor device 100 is mounted, from which a heatsink 70 is removed, FIG. 6B is a schematic sectional view along line A-A in FIG. 6A, and FIG. 6C is a schematic sectional view along line B-B in FIG. 6A. It is noted that a plurality of semiconductor devices 100 and a plurality of antennas 74 are mounted to a substrate 73, but in FIGS. 6A to 6C, one of the semiconductor devices 100 and one of the antennas 74 mounted to the substrate 73 are shown, while the others are not shown.

As shown in FIG. 6A, the semiconductor device 100 is surface-mounted on the substrate 73 of the electronic apparatus by solder 71. The substrate 73 has, on one surface thereof, ground pads 76, a signal pattern 77, and a signal pattern 78. A gate bias circuit is connected to the signal pattern 77, and a drain bias circuit is connected to the signal pattern 78, but the gate bias circuit and the drain bias circuit are not shown in FIGS. 6A to 6C.

As shown in FIG. 6B and FIG. 6C, the substrate 73 has the antenna 74 on the opposite surface. The substrate 73 has a ground wiring layer 75 almost over a whole internal surface. The ground wiring layer 75 serves as the ground of the electronic apparatus. The signal pattern 78 is conductive to the antenna 74 via a through hole 79. The ground wiring layer 75 is not provided around the through hole 79, so as not to be in contact with the through hole 79.

The ground pads 76 are conductive to the ground wiring layer 75 via a plurality of through holes 80. It is desirable that the through holes 80 are arranged closely to each other such that the interval between the through holes 80 is approximately equal to or smaller than ¼ of a wavelength λ corresponding to the maximum frequency at which the semiconductor device 100 is used.

In a state in which the semiconductor device 100 is surface-mounted on the substrate 73, the signal lead 22 and the signal lead 25 are covered by the first metal body 10. In addition, the signal lead 22 and the signal lead 25 are surrounded by the through holes 80 arranged closely to each other and the first metal body 10 and the ground wiring layer 75 which are conductive to each other via the through holes 80.

The heatsink 70 is provided in close contact with the heat dissipation surface 13 of the semiconductor device 100. Heat dissipation grease 72 is thinly applied on the heat dissipation surface 13 so that the heatsink 70 and the heat dissipation surface 13 are more closely in contact with each other and heat generated from the semiconductor device 100 is efficiently transferred to the heatsink 70.

Next, operation of the semiconductor device 100 according to embodiment 1 of the present invention will be described. As shown in FIGS. 5A to 5E and FIGS. 6A to 6C, the ground electrodes 97 of the semiconductor device 100 are conductive to the ground wiring layer 75 via the solder 71, the ground pads 76, and the through holes 80, and therefore the potential of the first metal body 10 is the same potential as the ground of the electronic apparatus to which the semiconductor device 100 is mounted. That is, the first metal body 10 is grounded.

A gate bias is supplied from the gate bias circuit (not shown), and passes through the signal pattern 77, the solder 71, the signal terminal 92 of the semiconductor device 100, the signal lead 22, the wire bond pad portion 32, the wire 3, and then the signal electrode connected to the gate of the semiconductor element 1, so as to be applied to the gate of the semiconductor element 1.

A drain bias is supplied from the drain bias circuit (not shown), and passes through the signal pattern 78, the solder 71, the signal terminal 95 of the semiconductor device 100, the signal lead 25, the wire bond pad portion 35, the wire 4, and then the signal electrode connected to the drain of the semiconductor element 1, so as to be applied to the drain of the semiconductor element 1.

In the above state, an RF signal propagated through the signal pattern 77 is propagated through the solder 71, the signal terminal 92 of the semiconductor device 100, the signal lead 22, the wire bond pad portion 32, the wire 3, and then the signal electrode connected to the gate of the semiconductor element 1, so as to be applied to the gate of the semiconductor element 1, and the RF signal is amplified by the semiconductor element 1. Similarly, the RF signal amplified by the semiconductor element 1 is propagated from the drain of the semiconductor element 1, through the signal electrode connected to the drain of the semiconductor element 1, the wire 4, the wire bond pad portion 35, the signal lead 25, the signal terminal 95 of the semiconductor device 100, and then the solder 71, to the signal pattern 78. The amplified RF signal propagated to the signal pattern 78 further passes through the through hole 79 so as to be supplied to the antenna 74, thus being radiated to the outside.

Heat HF generated in the semiconductor element 1 is transmitted from the back surface of the semiconductor element 1 to the first metal body 10 via the die-bonding material die-bonding the semiconductor element 1 to the first metal body 10, and then discharged from the heat dissipation surface 13 of the first metal body 10 to the heatsink 70 via the heat dissipation grease 72.

As described above, the semiconductor device 100 according to embodiment 1 of the present invention includes: the semiconductor element 1; the first metal body 10 having the die pad portion 11 to which the semiconductor element 1 is mounted, the semiconductor element 1 being mounted on the die bond surface 12 of the die pad portion 11; the second metal bodies 20 which have the wire bond pad portions 32 and 35 connected to the signal electrodes of the semiconductor element 1 via the wires 3 and 4, and are provided on the same side as the die bond surface 12 of the first metal body 10 on which the semiconductor element 1 is mounted, such that the second metal bodies 20 are separated from the first metal body 10 and covered by the first metal body 10, the second metal bodies 20 forming transmission lines together with the first metal body 10; and the molding resin 2 holding the first metal body 10 and the second metal bodies 20 such that the surface of the first metal body 10 opposite to the die bond surface 12 on which the semiconductor element 1 is mounted is exposed.

In addition, the antenna device according to embodiment 1 of the present invention includes: a plurality of semiconductor devices 100; the substrate 73 to which the plurality of semiconductor devices 100 are mounted; and a plurality of antennas 74 mounted on the surface of the substrate 73 opposite to the surface on which the plurality of semiconductor devices 100 are mounted.

In the semiconductor device 100 according to embodiment 1 of the present invention, the transmission lines formed by the first metal body 10 and the second metal bodies 20 are microstrip lines, as an example.

With the above structure, the heatsink 70 can be connected to the heat dissipation surface 13 of the semiconductor device 100. The heat HF generated in the semiconductor element 1 can be dissipated by being transmitted through the die bond surface 12, the first metal body 10, and the heat dissipation surface 13, to the heatsink 70. Thus, an effect of enabling efficient heat dissipation through a shorter path is provided as compared to the case of dissipating heat through the substrate 73 to which the semiconductor device 100 is surface-mounted.

As shown in FIG. 6B, the signal lead 22 and the signal lead 25 which are the second metal bodies are covered by the grounded first metal body 10, and surrounded by the ground wiring layer 75 and the through holes 80 arranged closely to each other. Thus, an electromagnetic shield function is obtained, thereby providing an effect of inhibiting oscillation due to coupling between the semiconductor devices 100 and deterioration of propagation property at a high frequency even in the case where the plurality of semiconductor devices 100 are arranged closely to each other.

In the semiconductor device 100 according to embodiment 1 of the present invention, the molding resin 2 holds the first metal body 10 and the second metal bodies 20 such that the die bond surface 12 and the wire bond pad portions 32, 35 are exposed. That is, in the semiconductor device 100 according to embodiment 1, the die bond surface 12 and the wire bond pad portions 32, 35 are not coated with the molding resin 2.

Thus, the semiconductor element 1 and the wires 3, 4 are not covered by the molding resin 2. Such a structure provides an effect of avoiding performance reduction of the transistor due to increase of a parasitic capacitance caused by the molding resin 2 covering an upper part of the semiconductor element 1, and deterioration of propagation property at a high frequency caused in the case of using a molding resin 2 having dielectric loss.

The interval between the first metal body 10 and the second metal bodies 20 forming the transmission lines may be made constant. In the case of performing power transmission at a high frequency, it is necessary to match the characteristic impedances of a signal source, a load, and a transmission path, in order to propagate power efficiently. However, in the structure disclosed in Patent Document 1, inside a high-frequency semiconductor device, the distance between inner lead portions and a bottom surface ground conductive layer having a ground potential varies along the signal propagation direction. Therefore, the characteristic impedance varies inside the high-frequency semiconductor device, so that return loss occurs, thus causing a problem that power cannot be efficiently propagated.

In the semiconductor device 100 according to embodiment 1 of the present invention, over the entire range of the signal lead 22 which is the second metal body provided in the same direction as X axis, the signal lead 22 and the first metal body 10 are arranged with an almost constant interval therebetween so that the characteristic impedance of the microstrip line formed by the first metal body 10 and the signal lead 22 which is the second metal body is almost constant at 50Ω.

Therefore, return loss due to discontinuity of the impedance inside the semiconductor device 100 does not occur, and also at the connection part between the semiconductor device 100 and the signal pattern 77, return loss due to discontinuity of the impedance does not occur. That is, an effect that power supplied from the outside of the semiconductor device 100 can be efficiently propagated to the semiconductor element 1, is provided.

Similarly, over the entire range of the signal lead 25 which is the second metal body provided in the same direction as X axis, the signal lead 25 and the first metal body 10 are arranged with an almost constant interval therebetween so that the characteristic impedance of the microstrip line formed by the first metal body 10 and the signal lead 25 which is the second metal body is almost constant at 50Ω. Therefore, return loss due to discontinuity of the impedance inside the semiconductor device 100 does not occur, and also at the connection part between the semiconductor device 100 and the signal pattern 78, return loss due to discontinuity of the impedance does not occur. Thus, an effect that power amplified by the semiconductor element 1 is efficiently propagated to the outside, is provided.

In embodiment 1, the number of signal electrodes of the semiconductor element 1 is two, and the signal lead 22 and the signal lead 25 connected thereto are the second metal bodies 20. However, the number of the second metal bodies 20 is not limited to two, and may be further increased in accordance with the configurations of the semiconductor element 1 and the semiconductor device 100. In embodiment 1, the second metal bodies 20 are provided in two opposite directions of the semiconductor device 100. However, the second metal bodies 20 may be provided in four directions, for example.

Embodiment 2

The structure of a semiconductor device 100 according to embodiment 2 of the present invention is the same as that in embodiment 1. However, operation of the semiconductor device 100 and the structure of the substrate to which the semiconductor device 100 is mounted are different from those in embodiment 1.

Figure 7A:
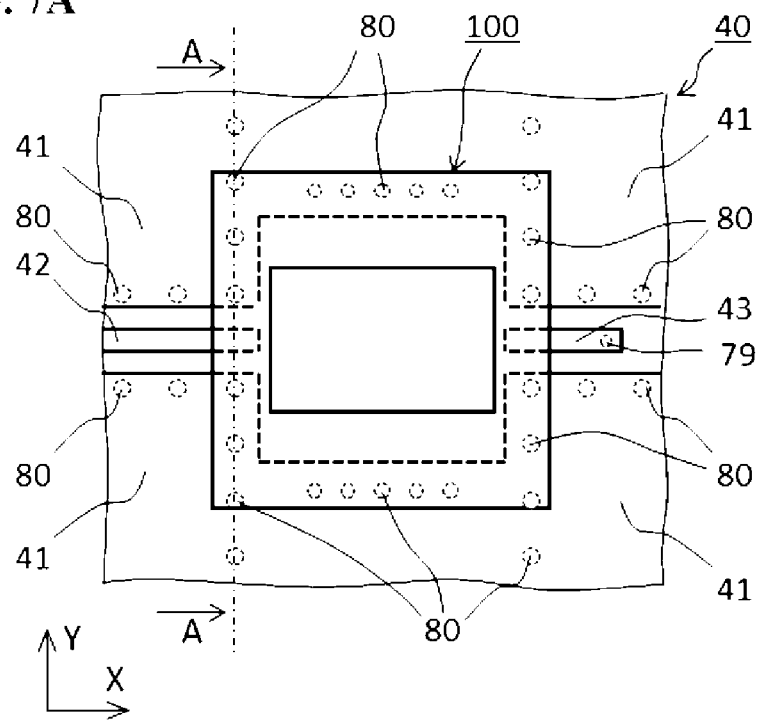
FIGS. 7A and 7B illustrate schematic views of an electronic apparatus to which a semiconductor device according to embodiment 2 of the present invention is mounted.
Figure 7B:
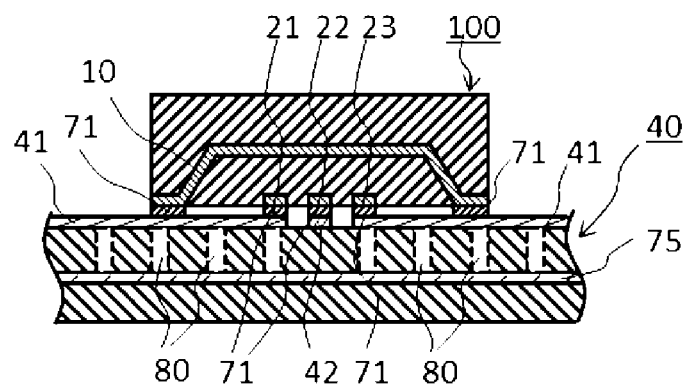

FIGS. 7A and 7B are schematic views of an electronic apparatus to which the semiconductor device 100 according to embodiment 2 is mounted. FIG. 7A is a schematic plan view of the electronic apparatus to which the semiconductor device 100 is mounted, and FIG. 7B is a schematic sectional view along line A-A in FIG. 7A. For the purpose of simplification, the heatsink 70 is not shown in FIGS. 7A and 7B.

As shown in FIG. 7A, a signal pattern 42 and a signal pattern 43 are provided on a surface layer of a substrate 40 so as to be separated from ground patterns 41. As in embodiment 1, a gate bias circuit is connected to the signal pattern 42, and a drain bias circuit is connected to the signal pattern 43. In FIGS. 7A and 7B, the gate bias circuit and the drain bias circuit are not shown. Although not shown in FIGS. 7A and 7B, as in the substrate 73 shown in FIGS. 6A to 6C, the signal pattern 43 on the substrate 40 is conductive to an antenna 74 via a through hole 79.

As shown in FIG. 7B, as in the substrate 73 shown in FIGS. 6A to 6C, the substrate 40 has a ground wiring layer 75 as the ground of the electronic apparatus almost over a whole internal surface of the substrate. The ground patterns 41 on the surface layer are conductive to the ground wiring layer 75 through a plurality of through holes 80, so as to be grounded.

The signal pattern 42 and the ground patterns 41 are provided such that, in two gaps formed by the signal pattern 42 and the ground patterns 41, the intervals between the signal pattern 42 and the ground patterns 41 are equal to each other. In addition, the signal pattern 43 and the ground patterns 41 are provided such that, in two gaps formed by the signal pattern 43 and the ground patterns 41, the intervals between the signal pattern 43 and the ground patterns 41 are equal to each other.

The signal pattern 42 is located between the ground patterns 41 present on the same plane as the signal pattern 42. The signal pattern 42 and the ground patterns 41 are opposed to the ground wiring layer 75 with the dielectric material of the substrate 40 interposed therebetween. The signal pattern 42, the ground patterns 41, and the ground wiring layer 75 form a grounded coplanar waveguide which is one type of transmission line.

The signal pattern 43 is located between the ground patterns 41 present on the same plane as the signal pattern 43. The signal pattern 43 and the ground patterns 41 are opposed to the ground wiring layer 75 with the dielectric material of the substrate 40 interposed therebetween. The signal pattern 43, the ground patterns 41, and the ground wiring layer 75 form a grounded coplanar waveguide which is one type of transmission line.

The signal terminal 92 of the semiconductor device 100 is conductive to the signal pattern 42 via solder 71. The signal terminal 95 of the semiconductor device 100 is conductive to the signal pattern 43 via solder 71.

The signal terminals 91, 93, 94, 96 and the ground terminals 97 of the semiconductor device 100 are conductive to the ground patterns 41 via solder 71, and the ground patterns 41 are conductive to the ground wiring layer 75, so that the signal leads 21, 23, 24, 26 and the first metal body 10 are grounded.

The signal lead 22 is located between the grounded signal lead 21 and the grounded signal lead 23, and the signal leads 21, 22, 23 are opposed to the grounded first metal body 10 with the dielectric molding resin 2 interposed therebetween. That is, the signal leads 21, 22, 23 and the first metal body 10 form a grounded coplanar waveguide which is one type of transmission line.

For example, in FIG. 7B, the thicknesses of the signal leads 21, 22, 23 are 0.2 mm, and the width of the signal lead 22 is 0.4 mm. The interval between the signal lead 21 and the signal lead 22 and the interval between the signal lead 22 and the signal lead 23 are 0.22 mm, and the interval between the first metal body 10 and the signal leads 21, 22, 23 is 0.4 mm. Further, the relative permittivity of the molding resin 2 is 3.6, so that the characteristic impedance at a frequency of 28 GHz is 50Ω.

In order that the characteristic impedance of the grounded coplanar waveguide formed by the signal leads 21, 22, 23 and the first metal body 10 becomes constant, it is desirable that the width of the signal lead 22, the interval between the signal lead 21 and the signal lead 22, the interval between the signal lead 22 and the signal lead 23, and the interval between the first metal body 10 and the signal leads 21, 22, 23, are almost constant over the entire range of the signal lead 22.

TABLE 2

| Signal lead intervals between 21 and 22 and between 22 and 23 (mm) | 0.16 | 0.185 | 0.20 | 0.22 | 0.24 | 0.27 | 0.28 |
|---|---|---|---|---|---|---|---|
| Relative value with respect to design value | 0.72 | 0.83 | 0.90 | 1.00 | 1.08 | 1.21 | 1.26 |
| Return loss (dB) | 24.6 | 30.0 | 33.7 | +∞ | 37.2 | 30.3 | 27.9 |

TABLE 3

| Interval between first metal body 10 and signal leads 21, 22, 23 (mm) | 0.25 | 0.31 | 0.35 | 0.40 | 0.50 | 0.58 | 0.70 |
|---|---|---|---|---|---|---|---|
| Relative value with respect to design value | 0.63 | 0.78 | 0.88 | 1.00 | 1.25 | 1.45 | 1.75 |
| Return loss (dB) | 23.9 | 30.1 | 36.4 | +∞ | 33.8 | 30.1 | 27.7 |

Table 2 shows return loss in the case where the interval between the signal leads 21 and 22 and the interval between the signal leads 22 and 23 are changed. Table 3 shows return loss in the case where the interval between the first metal body 10 and the signal leads 21, 22, 23 is changed.

The interval between the signal leads 21 and 22 and the interval between the signal leads 22 and 23 in embodiment 2 are set at a design value of 0.22 mm. The interval between the first metal body 10 and the signal leads 21, 22, 23 is set at a design value of 0.4 mm. Even in the case where these values cannot be made perfectly constant due to working constraint, tolerance, and the like in manufacturing, for example, if the interval between the signal leads 21 and 22 and the interval between the signal leads 22 and 23 are set in a range of 0.185 mm to 0.27 mm, return loss due to variation in the characteristic impedance becomes 30 dB or greater, whereby favorable characteristics can be obtained. This corresponds to a range in which a value obtained by dividing each of the interval between the signal leads 21 and 22 and the interval between the signal leads 22 and 23 by the design value of 0.22 mm, i.e., a relative value with respect to the design value, is 0.83 to 1.21. That is, for the interval between the signal lead 21 and the signal lead 22 and the interval between the signal lead 22 and the signal lead 23, a tolerance in a range of ±17% with respect to the set value is permissible.

In addition, if the interval between the first metal body 10 and the signal leads 21, 22, 23 is set in a range not less than 0.31 mm and not greater than 0.58 mm, return loss due to variation in the characteristic impedance becomes 30 dB or greater, whereby favorable characteristics can be obtained. This corresponds to a range in which a value obtained by dividing the interval between the first metal body 10 and the signal leads 21, 22, 23 by a design value of 0.4 mm, i.e., a relative value with respect to the design value, is 0.78 to 1.45. That is, for the interval between the first metal body 10 and the signal leads 21, 22, 23, a tolerance in a range of ±22% with respect to the set value is permissible.

Similarly, the signal leads 24, 25, 26 and the first metal body 10 form a grounded coplanar waveguide. For example, the thicknesses of the signal leads 24, 25, 26 are 0.2 mm, the width of the signal lead 25 is 0.4 mm, the interval between the signal lead 24 and the signal lead 25 and the interval between the signal lead 25 and the signal lead 26 are 0.22 mm, the interval between the first metal body 10 and the signal leads 24, 25, 26 is 0.4 mm, and the relative permittivity of the molding resin 2 is 3.6, so that the characteristic impedance at a frequency of 28 GHz is 50Ω. It is desirable that such a configuration is almost constant over the entire range of the signal lead 25.

As described above, the semiconductor device 100 according to embodiment 2 of the present invention includes: the semiconductor element 1; the first metal body 10 having the die pad portion 11 to which the semiconductor element 1 is mounted, the semiconductor element 1 being mounted on the die bond surface 12 of the die pad portion 11; the second metal bodies 20 which have the wire bond pad portions 32 and 35 connected to the signal electrodes of the semiconductor element 1 via the wires 3 and 4, and are provided on the same side as the die bond surface 12 of the first metal body 10 on which the semiconductor element 1 is mounted, such that the second metal bodies 20 are separated from the first metal body 10 and covered by the first metal body 10, the second metal bodies 20 forming transmission lines together with the first metal body 10; and the molding resin 2 holding the first metal body 10 and the second metal bodies 20 such that the surface of the first metal body 10 opposite to the die bond surface 12 on which the semiconductor element 1 is mounted is exposed. The transmission lines formed by the first metal body 10 and the second metal bodies 20 are grounded coplanar waveguides.

With the above structure, as in the semiconductor device 100 shown in embodiment 1, an effect that heat HF generated in the semiconductor element 1 can be efficiently dissipated is provided. In addition, even in the case where a plurality of semiconductor devices 100 are arranged closely to each other, an effect of inhibiting oscillation due to coupling between the semiconductor devices 100 and deterioration of propagation property at a high frequency, is provided. Further, an effect that power supplied from the outside of the semiconductor device 100 can be efficiently propagated to the semiconductor element 1 and power amplified by the semiconductor element 1 is efficiently propagated to the outside, is provided.

In FIGS. 7A and 7B, the widths of the signal leads 21 to 26 are the same, but it is desirable that the widths of the signal leads 21, 23, 24, 26 serving as ground conductors for the grounded coplanar waveguides are expanded in a possible range. The wire bond pad portions 31, 33, 34, 36 and the die bond surface 12 may be connected by wires, metal ribbons, or the like, whereby the signal leads 21, 23, 24, 26 may be more reliably grounded.

Embodiment 3

The structure of a semiconductor device 300 according to embodiment 3 of the present invention will be described with reference to FIGS. 8A to 8C, FIGS. 9A to 9C, and FIGS. 10A to 10D.

Figure 8A:
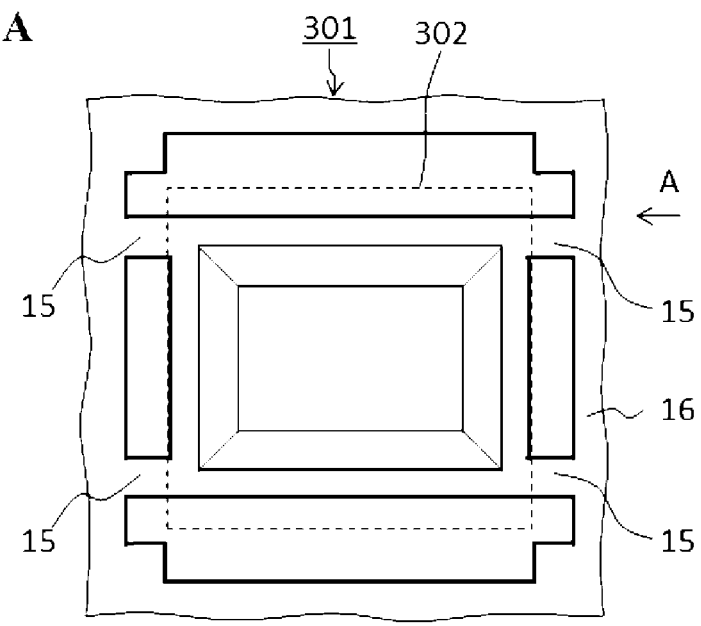
FIGS. 8A to 8C illustrate a plan view, a side view, and a front view of a lead frame including a first metal body, used in a semiconductor device according to embodiment 3 of the present invention.
Figure 8B:
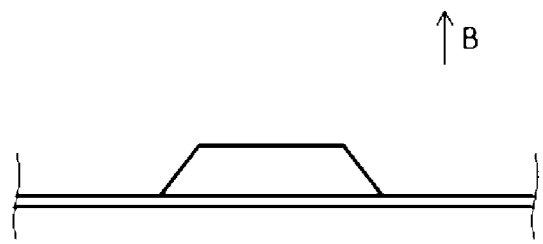
Figure 8C:
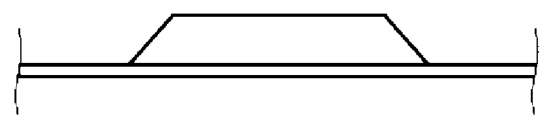

FIGS. 8A to 8C are a plan view, a side view, and a front view of a lead frame 301 including a first metal body, used in the semiconductor device 300 according to embodiment 3. FIG. 8A is a plan view of the lead frame 301 as seen from the top, FIG. 8B is a side view of the lead frame 301 as seen from the direction of arrow A in FIG. 8A, and FIG. 8C is a front view of the lead frame 301 as seen from the direction of arrow B in FIG. 8A.

FIGS. 8A to 8C show the lead frame 301 before the semiconductor device 300 is formed. The lead frame 301 includes a first metal body 302 forming the semiconductor device 300. Unlike the first metal body 10 used in the semiconductor device 100 according to embodiment 1 shown in FIGS. 3A to 3C, the first metal body 302 does not form a ground terminal for the semiconductor device 300.

Figure 9A:
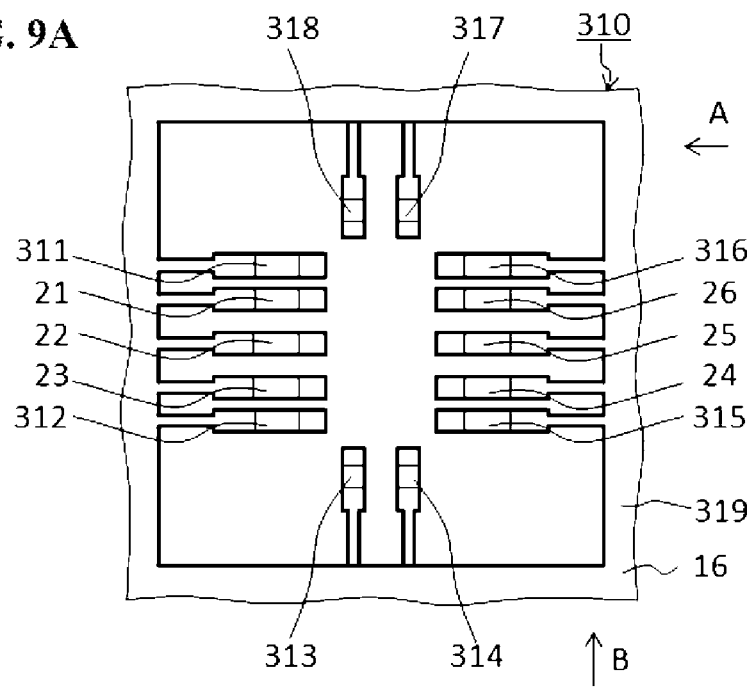
FIGS. 9A to 9C illustrate a plan view, a side view, and a front view of a lead frame including a second metal body and a third metal body, used in the semiconductor device according to embodiment 3 of the present invention.
Figure 9B:
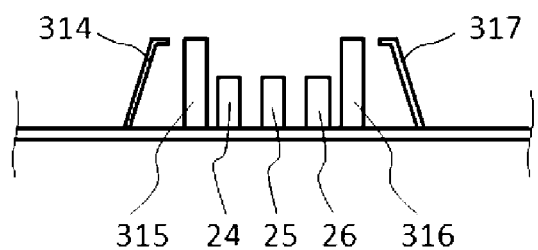
Figure 9C:
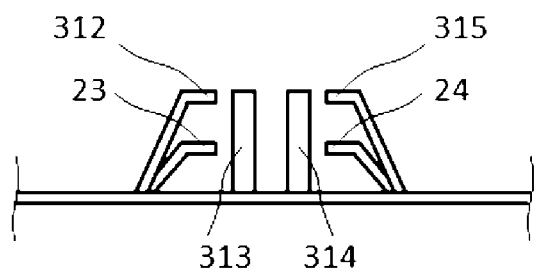

FIGS. 9A to 9C are a plan view, a side view, and a front view of a lead frame 310 including second metal bodies and third metal bodies, used in the semiconductor device 300 according to embodiment 3. FIG. 9A is a plan view of the lead frame 310 as seen from the top, FIG. 9B is a side view of the lead frame 310 as seen from the direction of arrow A in FIG. 9A, and FIG. 9C is a front view of the lead frame 310 as seen from the direction of arrow B in FIG. 9A.

FIGS. 9A to 9C show the lead frame 310 before the semiconductor device 300 is formed. The lead frame 310 has signal leads 21, 22, 23, 24, 25, 26, as in the lead frame 29 used in the semiconductor device 100 according to embodiment 1 shown in FIGS. 4A to 4C. Further, the lead frame 310 includes signal leads 311, 312, 313, 314, 315, 316, 317, 318.

Figure 10A:
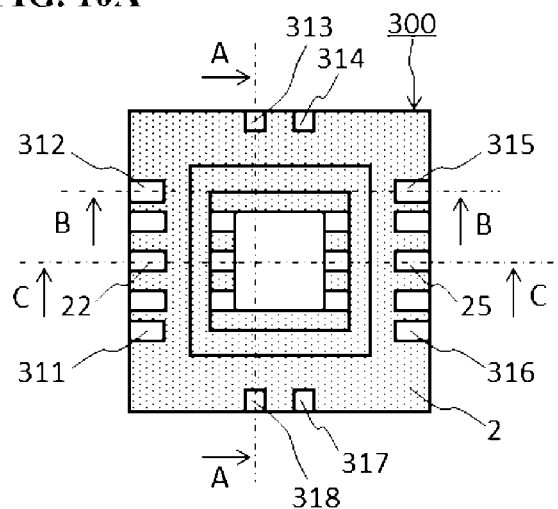
FIGS. 10A to 10D illustrate the semiconductor device according to embodiment 3 of the present invention.
Figure 10B:
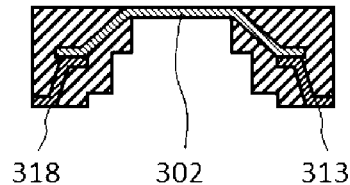
Figure 10C:
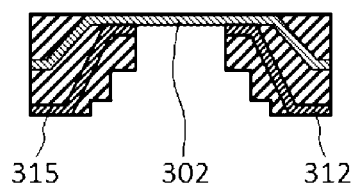
Figure 10D:
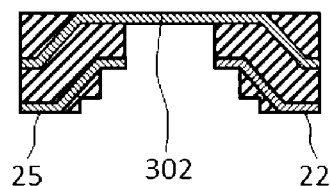

FIGS. 10A to 10D illustrate the semiconductor device 300 according to embodiment 3. FIG. 10A is a plan view of the semiconductor device 300 as seen from the bottom, FIG. 10B is a sectional view of the semiconductor device 300 as seen from the direction of arrows A in FIG. 10A, FIG. 10C is a sectional view of the semiconductor device 300 as seen from the direction of arrows B in FIG. 10A, and FIG. 10D is a sectional view of the semiconductor device 300 as seen from the direction of arrows C in FIG. 10A. It is noted that parts unnecessary for description are not shown, as appropriate.

The signal leads 311, 312, 313, 314, 315, 316, 317, 318 are third metal bodies. As shown in FIG. 10A, the signal leads 311, 312, 313, 314, 315, 316, 317, 318 which are the third metal bodies are exposed on the back surface of the semiconductor device 300, and the exposed parts form ground terminals of the semiconductor device 300.

As shown in FIGS. 10B and 10C, the first metal body 302 is held by the molding resin 2, in a state of being in contact with and conductive to the signal leads 311, 312, 313, 314, 315, 316, 317, 318 which are the third metal bodies, inside the semiconductor device 300. That is, the first metal body 302 is conductive to the ground electrodes formed by the third metal bodies. Description of the other parts is omitted.

As described above, the semiconductor device 300 according to embodiment 3 of the present invention includes: the semiconductor element 1; the first metal body 302 having the die pad portion 11 to which the semiconductor element 1 is mounted, the semiconductor element 1 being mounted on the die bond surface 12 of the die pad portion 11; the second metal bodies 20 which have the wire bond pad portions 32 and 35 connected to the signal electrodes of the semiconductor element 1 via the wires 3 and 4, and are provided on the same side as the die bond surface 12 of the first metal body 302 on which the semiconductor element 1 is mounted, such that the second metal bodies 20 are separated from the first metal body 302 and covered by the first metal body 302, the second metal bodies 20 forming transmission lines together with the first metal body 302; and the molding resin 2 holding the first metal body 302 and the second metal bodies 20 such that the surface of the first metal body 302 opposite to the die bond surface 12 on which the semiconductor element 1 is mounted is exposed. Further, the semiconductor device 300 includes the signal leads 311, 312, 313, 314, 315, 316, 317, 318 which are the third metal bodies. The third metal bodies form the ground terminals of the semiconductor device 300, and are held by the molding resin 2 in a state in which the third metal bodies are in contact with and conductive to the first metal body 302.

With the above structure, as in the semiconductor device 100 shown in embodiment 1, the semiconductor device 300 provides an effect that heat HF generated in the semiconductor element 1 can be efficiently dissipated. In addition, even in the case where a plurality of semiconductor devices 300 are arranged closely to each other, an effect of inhibiting oscillation due to coupling between the semiconductor devices 300 and deterioration of propagation property at a high frequency, is provided. Further, an effect that power supplied from the outside of the semiconductor device 300 can be efficiently propagated to the semiconductor element 1 and power amplified by the semiconductor element 1 is efficiently propagated to the outside, is provided.

Further, in the semiconductor device 300 according to embodiment 3, the lead frame 310 forms ground terminals, so that the lead frame 301 can have a simple and easily workable shape, thus providing an effect of increasing the degree of freedom in designing as compared to embodiment 1.

Embodiment 4

The structure of a semiconductor device 400 according to embodiment 4 of the present invention will be described with reference to FIGS. 11A to 11C, FIGS. 12A to 12C, and FIGS. 13A to 13C.

Figure 11A:
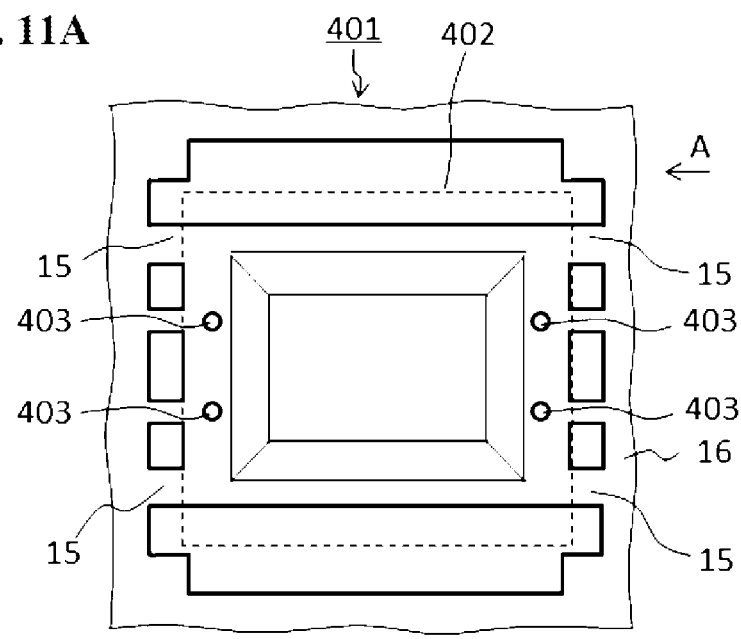
FIGS. 11A to 11C illustrate a plan view, a side view, and a front view of a lead frame including a first metal body, used in a semiconductor device according to embodiment 4 of the present invention.
Figure 11B:
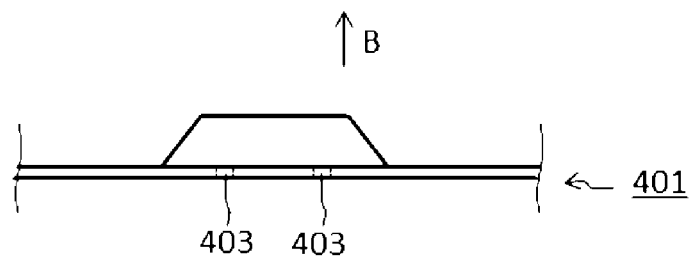
Figure 11C:
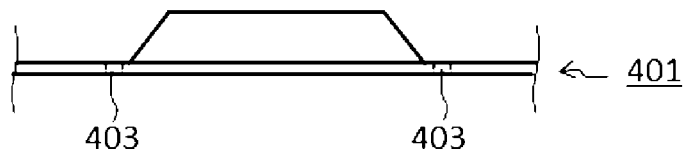

FIGS. 11A to 11C are a plan view, a side view, and a front view of a lead frame 401 including a first metal body, used in the semiconductor device 400 according to embodiment 4. FIG. 11A is a plan view of the lead frame 401 as seen from the top, FIG. 11B is a side view of the lead frame 401 as seen from the direction of arrow A in FIG. 11A, and FIG. 11C is a front view of the lead frame 401 as seen from the direction of arrow B in FIG. 11A.

FIGS. 11A to 11C show the lead frame 401 before the semiconductor device 400 is formed. The lead frame 401 includes a first metal body 402 of the semiconductor device 400. The lead frame 401 has a plurality of holes 403 penetrating through the lead frame 401.

Figure 12A:
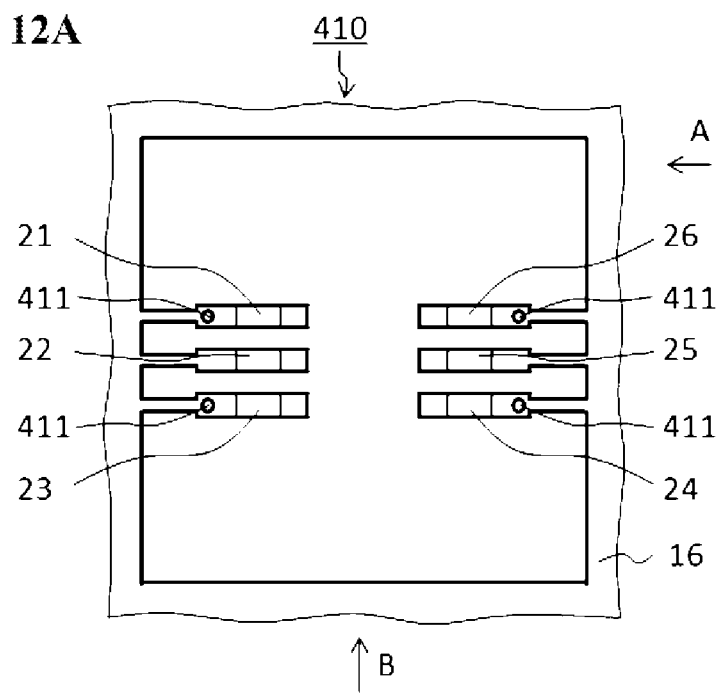
FIGS. 12A to 12C illustrate a plan view, a side view, and a front view of a lead frame including a second metal body and a third metal body, used in the semiconductor device according to embodiment 4 of the present invention.
Figure 12B:
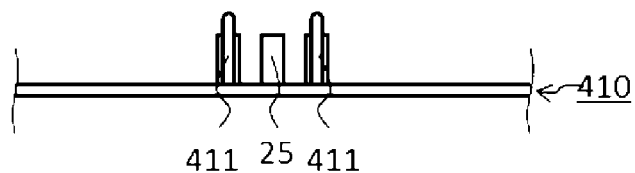
Figure 12C:
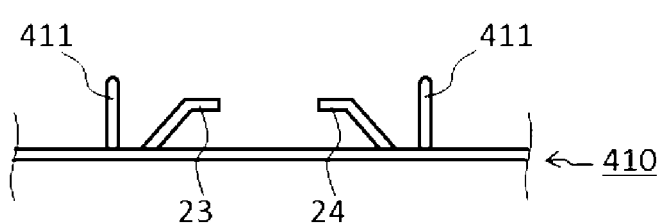

FIGS. 12A to 12C are a plan view, a side view, and a front view of a lead frame 410 including second metal bodies and third metal bodies, used in the semiconductor device 400 according to embodiment 4. FIG. 12A is a plan view of the lead frame 410 as seen from the top, FIG. 12B is a side view of the lead frame 410 as seen from the direction of arrow A in FIG. 12A, and FIG. 12C is a front view of the lead frame 410 as seen from the direction of arrow B in FIG. 12A.

FIGS. 12A to 12C show the lead frame 410 before the semiconductor device 400 is formed. The signal leads 21, 23, 24, 26 of the lead frame 410 are provided with columnar protrusions 411. The material of the protrusions 411 is metal, and the protrusions 411 and the signal leads 21, 23, 24, 26 are conductive to each other. The diameter of the protrusion 411 is set to be small so that the protrusion 411 can be inserted into the hole 403 of the lead frame 401. The other configurations are the same as in the lead frame 29 shown in FIGS. 4A to 4C.

Figure 13A:
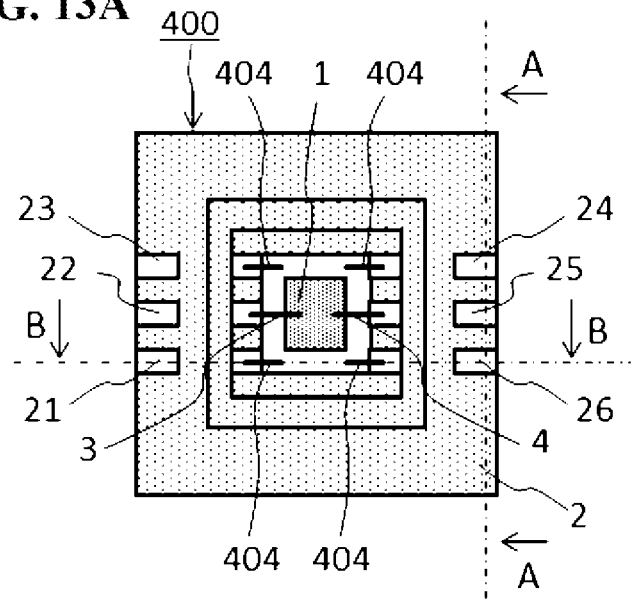
FIGS. 13A to 13C illustrate the semiconductor device according to embodiment 4 of the present invention.
Figure 13B:
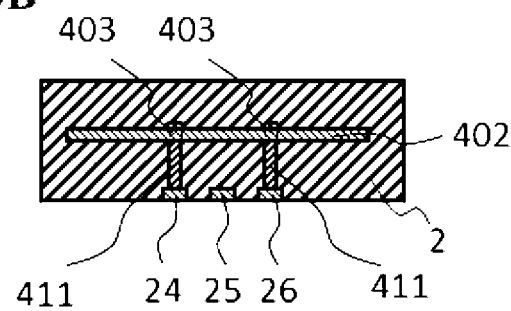
Figure 13C:
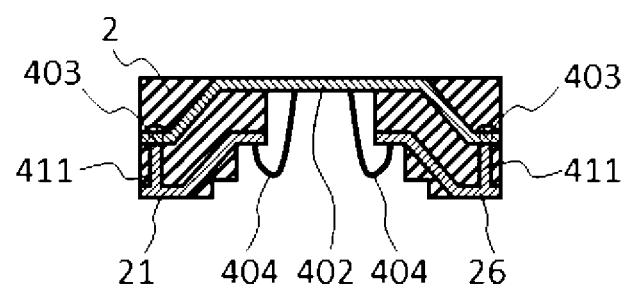

FIGS. 13A to 13C illustrate the semiconductor device 400 according to embodiment 4. Parts unnecessary for description are not shown, as appropriate. FIG. 13A is a bottom view of the semiconductor device 400 as seen from the bottom, FIG. 13B is a sectional view of the semiconductor device 400 along line A-A in FIG. 13A, and FIG. 13C is a sectional view of the semiconductor device 400 along line B-B in FIG. 13A.

In embodiment 4, the signal leads 21, 23, 24, 26 are third metal bodies. As shown in FIG. 13A, the signal leads 21, 23, 24, 26 which are the third metal bodies are exposed on the back surface of the semiconductor device 400, and the exposed parts form ground terminals of the semiconductor device 400.

As shown in FIGS. 13A and 13C, inside the semiconductor device 400, the signal leads 21, 23, 24, 26 are connected to the first metal body 402 via wires 404 made of metal. That is, the signal leads 21, 23, 24, 26 are conductive to the first metal body 402 via the wires 404.

As shown in FIGS. 13B and 13C, the protrusions 411 provided to the signal leads 21, 23, 24, 26 are inserted into the plurality of holes 403 provided in the first metal body 402, so as to penetrate through the first metal body 402. The ends of the protrusions 411 are struck and crushed into an umbrella shape so as to have larger diameters than the holes 403. The parts formed in an umbrella shape are held by the molding resin 2, in a state of being in contact with the first metal body 402.

That is, the first metal body 402 is conductive to the ground electrodes formed by the third metal bodies. Description of the other parts is omitted.

As described above, the semiconductor device 400 according to embodiment 4 of the present invention includes: the semiconductor element 1; the first metal body 402 having the die pad portion 11 to which the semiconductor element 1 is mounted, the semiconductor element 1 being mounted on the die bond surface 12 of the die pad portion 11; the second metal bodies 20 which have the wire bond pad portions 32 and 35 connected to the signal electrodes of the semiconductor element 1 via the wires 404, and are provided on the same side as the die bond surface 12 of the first metal body 402 on which the semiconductor element 1 is mounted, such that the second metal bodies 20 are separated from the first metal body 402 and covered by the first metal body 402, the second metal bodies 20 forming transmission lines together with the first metal body 402; and the molding resin 2 holding the first metal body 402 and the second metal bodies 20 such that the surface of the first metal body 402 opposite to the die bond surface 12 on which the semiconductor element 1 is mounted is exposed.

Further, the semiconductor device 400 includes the signal leads 21, 23, 24, 26 which are the third metal bodies forming the ground terminals of the semiconductor device 400. The signal leads 21, 23, 24, 26 which are the third metal bodies are provided with the protrusions 411. The third metal bodies are held by the molding resin 2 in a state in which the protrusions 411 are in contact with and conductive to the first metal body 402. In addition, the third metal bodies are connected to the first metal body 402 also via the wires 404 so as to be conductive thereto.

With the above structure, as in the semiconductor device 100 shown in embodiment 1, the semiconductor device 400 provides an effect that heat HF generated in the semiconductor element 1 can be efficiently dissipated. In addition, even in the case where a plurality of semiconductor devices 400 are arranged closely to each other, an effect of inhibiting oscillation due to coupling between the semiconductor devices 400 and deterioration of propagation property at a high frequency, is provided. Further, an effect that power supplied from the outside of the semiconductor device 400 can be efficiently propagated to the semiconductor element 1 and power amplified by the semiconductor element 1 is efficiently propagated to the outside, is provided.

Further, in the semiconductor device 400 according to embodiment 4, the ends of the protrusions 411 provided to the signal leads 21, 23, 24, 26 are inserted into the holes 403 provided in the first metal body 402, and the end parts of the inserted protrusions are formed in an umbrella shape so as to have larger diameters than the holes 403, thus providing an effect of preventing the signal leads 21, 23, 24, 26 from coming off.

Embodiment 5

The structure of a semiconductor device 500 according to embodiment 5 of the present invention will be described with reference to FIGS. 14A to 14C and FIGS. 15A to 15C.

Figure 14A:
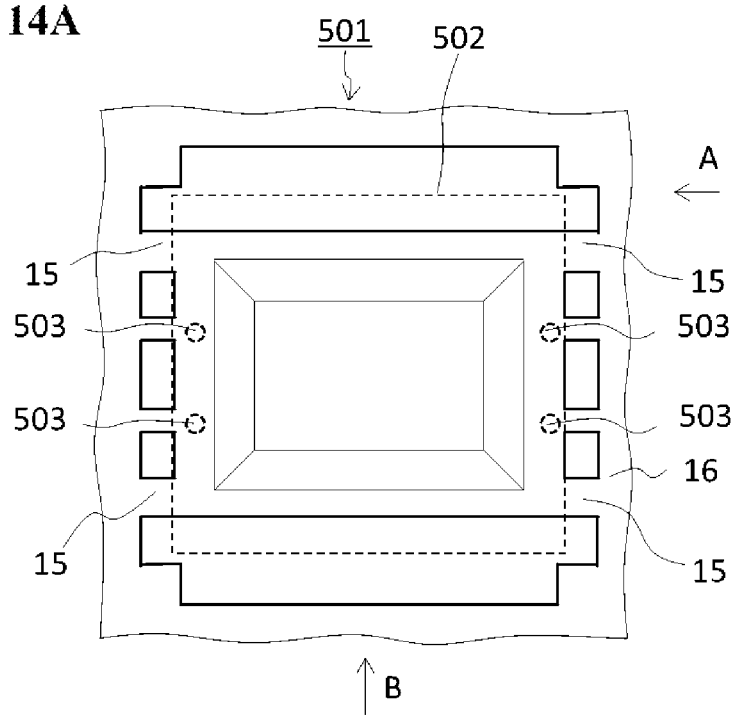
FIGS. 14A to 14C illustrate a plan view, a side view, and a front view of a lead frame used in a semiconductor device according to embodiment 5 of the present invention.
Figure 14B:
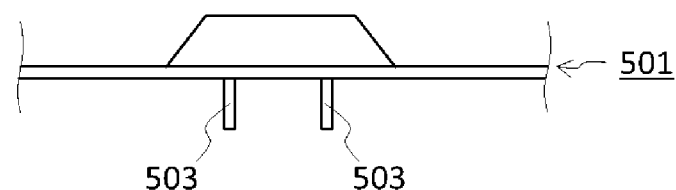
Figure 14C:
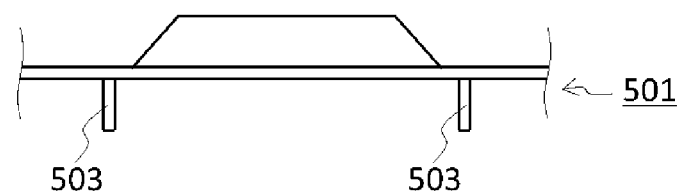

FIGS. 14A to 14C are a plan view, a side view, and a front view of a lead frame 501 used in the semiconductor device 500 according to embodiment 5. FIG. 14A is a plan view of the lead frame 501 as seen from the top, FIG. 14B is a side view of the lead frame 501 as seen from the direction of arrow A in FIG. 14A, and FIG. 14C is a front view of the lead frame 501 as seen from the direction of arrow B in FIG. 14A.

FIGS. 14A to 14C show the lead frame 501 before the semiconductor device 500 is formed. The lead frame 501 includes a first metal body 502 of the semiconductor device 500. The first metal body 502 is provided with a plurality of protrusions 503.

Figure 15A:
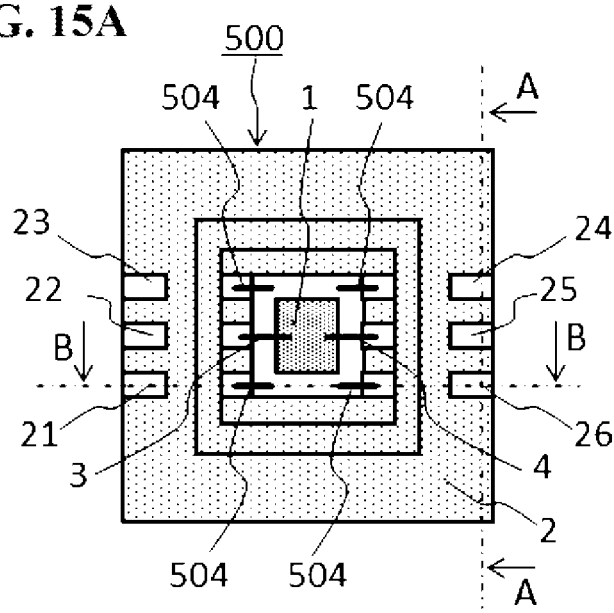
FIGS. 15A to 15C illustrate the semiconductor device according to embodiment 5 of the present invention.
Figure 15B:
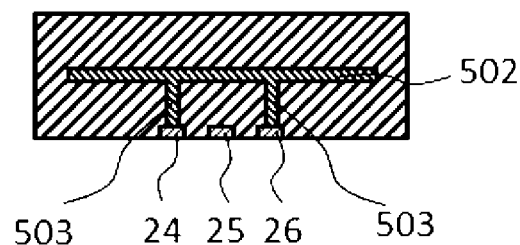
Figure 15C:
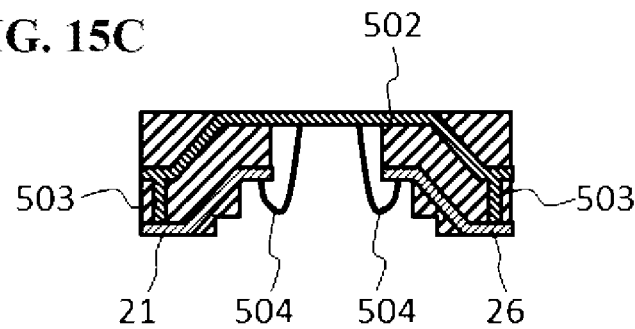

FIGS. 15A to 15C illustrate the semiconductor device 500 according to embodiment 5. Parts unnecessary for description are not shown, as appropriate. FIG. 15A is a bottom view of the semiconductor device 500 as seen from the bottom, FIG. 15B is a sectional view of the semiconductor device 500 along line A-A in FIG. 15A, and FIG. 15C is a sectional view of the semiconductor device 500 along line B-B in FIG. 15A.

The signal leads 21, 23, 24, 26 are third metal bodies. As shown in FIG. 15A, the signal leads 21, 23, 24, 26 which are the third metal bodies are exposed on the back surface of the semiconductor device 500, and the exposed parts form ground terminals of the semiconductor device 500.

As shown in FIGS. 15B and 15C, the signal leads 21, 23, 24, 26 are held by the molding resin 2, in a state of being in contact with and conductive to the protrusions 503 provided to the first metal body 502.

As shown in FIGS. 15A and 15C, inside the semiconductor device 500, the signal leads 21, 23, 24, 26 are connected to the first metal body 502 via wires 504 made of metal. That is, the signal leads 21, 23, 24, 26 are conductive to the first metal body 502 via the wires 504.

That is, the first metal body 502 is conductive to the ground electrodes formed by the third metal bodies. Description of the other parts is omitted.

As described above, the semiconductor device 500 according to embodiment 5 of the present invention includes: the semiconductor element 1; the first metal body 502 having the die pad portion 11 to which the semiconductor element 1 is mounted, the semiconductor element 1 being mounted on the die bond surface 12 of the die pad portion 11; the second metal bodies 20 which have the wire bond pad portions 32 and 35 connected to the signal electrodes of the semiconductor element 1 via the wires 504, and are provided on the same side as the die bond surface 12 of the first metal body 502 on which the semiconductor element 1 is mounted, such that the second metal bodies 20 are separated from the first metal body 502 and covered by the first metal body 502, the second metal bodies 20 forming transmission lines together with the first metal body 502; and the molding resin 2 holding the first metal body 502 and the second metal bodies 20 such that the surface of the first metal body 502 opposite to the die bond surface 12 on which the semiconductor element 1 is mounted is exposed.

Further, the semiconductor device 500 includes the signal leads 21, 23, 24, 26 which are the third metal bodies forming the ground terminals of the semiconductor device 500. The third metal bodies are held by the molding resin 2, in a state of being in contact with and conductive to the protrusions 503 provided to the first metal body 502. The third metal bodies are connected to the first metal body 502 also via the wires 504 so as to be conductive thereto.

With the above structure, as in the semiconductor device 100 shown in embodiment 1, the semiconductor device 500 provides an effect that heat HF generated in the semiconductor element 1 can be efficiently dissipated. In addition, even in the case where a plurality of semiconductor devices 500 are arranged closely to each other, an effect of inhibiting oscillation due to coupling between the semiconductor devices 500 and deterioration of propagation property at a high frequency, is provided. Further, an effect that power supplied from the outside of the semiconductor device 500 can be efficiently propagated to the semiconductor element 1 and power amplified by the semiconductor element 1 is efficiently propagated to the outside, is provided.

Embodiment 6

The structure of a semiconductor device 600 according to embodiment 6 of the present invention will be described with reference to FIGS. 16A to 16C, FIGS. 17A to 17C, and FIGS. 18A to 18C.

Figure 16A:
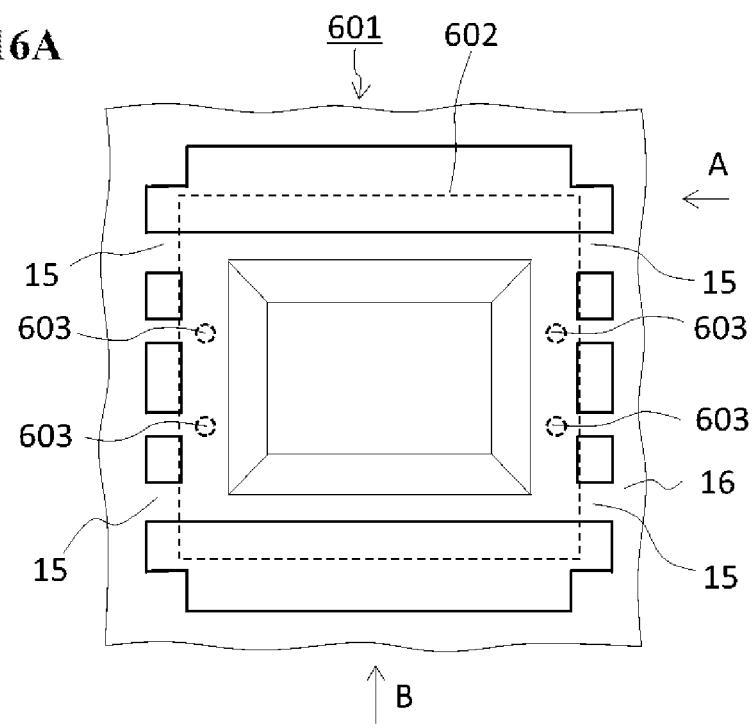
FIGS. 16A to 16C illustrate a plan view, a side view, and a front view of a lead frame including a first metal body, used in a semiconductor device according to embodiment 6 of the present invention.
Figure 16B:
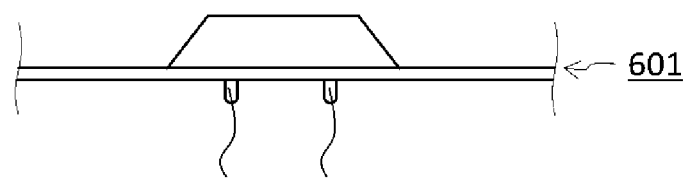
Figure 16C:
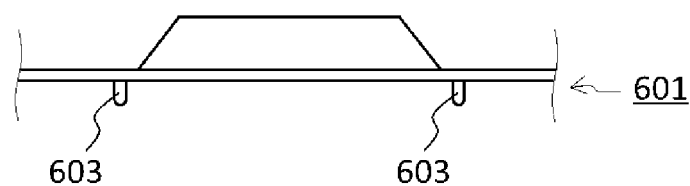

FIGS. 16A to 16C are a plan view, a side view, and a front view of a lead frame 601 including a first metal body, used in the semiconductor device 600 according to embodiment 6. FIG. 16A is a plan view of the lead frame 601 as seen from the top, FIG. 16B is a side view of the lead frame 601 as seen from the direction of arrow A in FIG. 16A, and FIG. 16C is a front view of the lead frame 601 as seen from the direction of arrow B in FIG. 16A.

FIGS. 16A to 16C show the lead frame 601 before the semiconductor device 600 is formed.

The lead frame 601 includes a first metal body 602 of the semiconductor device 600. The first metal body 602 is provided with a plurality of protrusions 603. The protrusions 603 are formed by gold bumps. Alternatively, the protrusions 603 may be formed by solder bumps, plating, drawing, or the like.

Figure 17A:
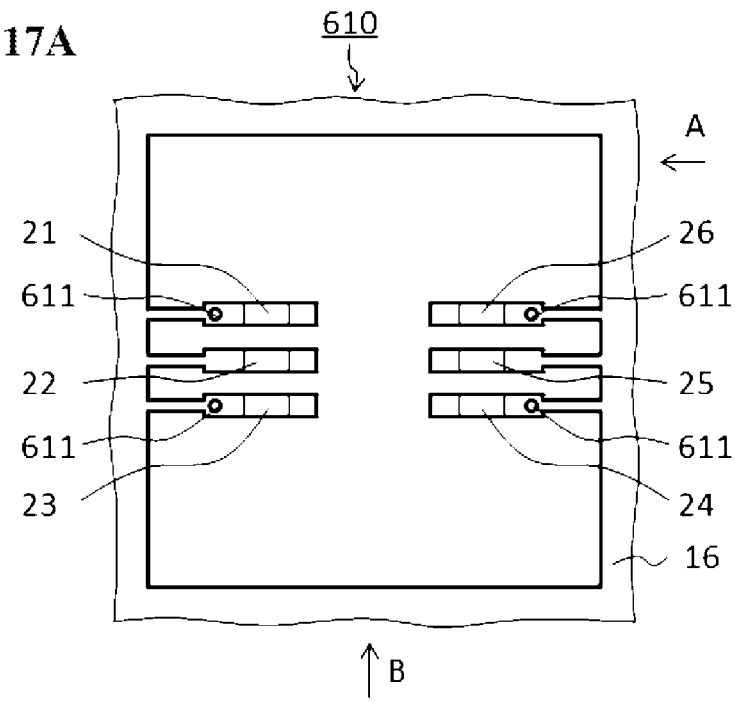
FIGS. 17A to 17C illustrate a plan view, a side view, and a front view of a lead frame including a second metal body and a third metal body, used in the semiconductor device according to embodiment 6 of the present invention.
Figure 17B:
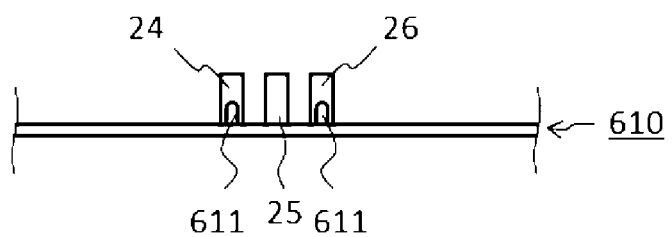
Figure 17C:
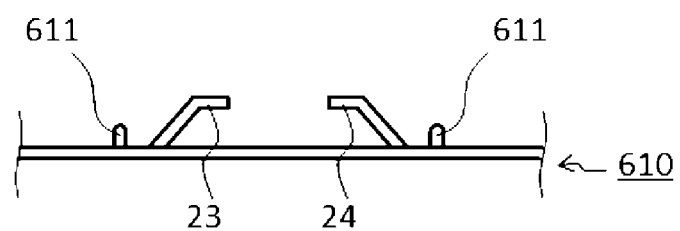

FIGS. 17A to 17C are a plan view, a side view, and a front view of a lead frame 610 including second metal bodies and third metal bodies, used in the semiconductor device 600 according to embodiment 6. FIG. 17A is a plan view of the lead frame 610 as seen from the top, FIG. 17B is a side view of the lead frame 610 as seen from the direction of arrow A in FIG. 17A, and FIG. 17C is a front view of the lead frame 610 as seen from the direction of arrow B in FIG. 17A.

FIGS. 17A to 17C show the lead frame 610 before the semiconductor device 600 is formed. The signal leads 21, 23, 24, 26 of the lead frame 610 are provided with protrusions 611. The protrusions 611 are formed by gold bumps. Alternatively, the protrusions 611 may be formed by solder bumps, plating, drawing, or the like.

Figure 18A:
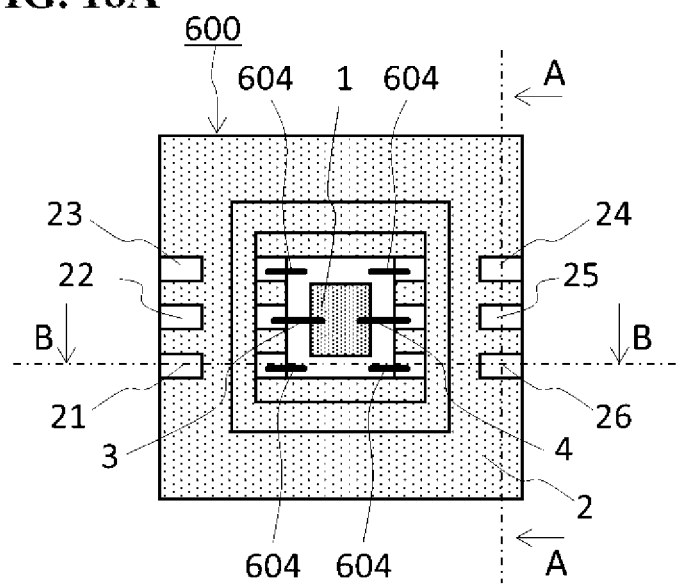
FIGS. 18A to 18C illustrate the semiconductor device according to embodiment 6 of the present invention.
Figure 18B:
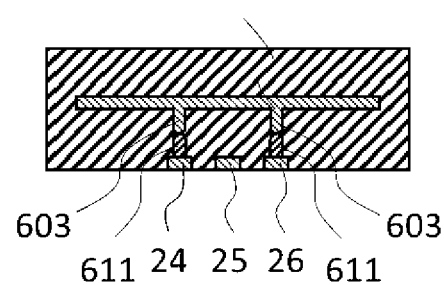
Figure 18C:
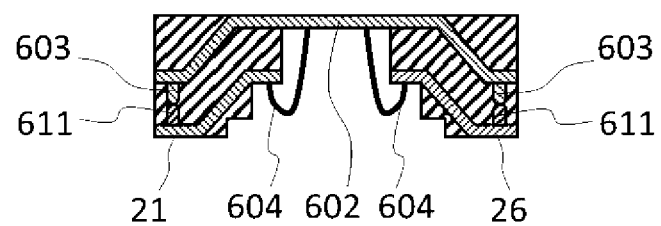

FIGS. 18A to 18C illustrate the semiconductor device 600 according to embodiment 6. Parts unnecessary for description are not shown, as appropriate. FIG. 18A is a bottom view of the semiconductor device 600 as seen from the bottom, FIG. 18B is a sectional view of the semiconductor device 600 along line A-A in FIG. 18A, and FIG. 18C is a sectional view of the semiconductor device 600 along line B-B in FIG. 18A.

The signal leads 21, 23, 24, 26 are third metal bodies. As shown in FIG. 18A, the signal leads 21, 23, 24, 26 which are the third metal bodies are exposed on the back surface of the semiconductor device 600, and the exposed parts form ground terminals of the semiconductor device 600.

As shown in FIGS. 18B and 18C, the protrusions 611 provided to the signal leads 21, 23, 24, 26 are held by the molding resin 2, in a state of being in contact with and conductive to the protrusions 603 provided to the first metal body 602.

As shown in FIGS. 18A and 18C, inside the semiconductor device 600, the signal leads 21, 23, 24, 26 are connected to the first metal body 602 via wires 604 made of metal. That is, the signal leads 21, 23, 24, 26 are conductive to the first metal body 602 via the wires 604.

That is, the first metal body 602 is conductive to the ground electrodes formed by the third metal bodies. Description of the other parts is omitted.

As described above, the semiconductor device 600 according to embodiment 6 of the present invention includes: the semiconductor element 1; the first metal body 602 having the die pad portion 11 to which the semiconductor element 1 is mounted, the semiconductor element 1 being mounted on the die bond surface 12 of the die pad portion 11; the second metal bodies 20 which have the wire bond pad portions 32 and 35 connected to the signal electrodes of the semiconductor element 1 via the wires 604, and are provided on the same side as the die bond surface 12 of the first metal body 602 on which the semiconductor element 1 is mounted, such that the second metal bodies 20 are separated from the first metal body 602 and covered by the first metal body 602, the second metal bodies 20 forming transmission lines together with the first metal body 602; and the molding resin 2 holding the first metal body 602 and the second metal bodies 20 such that the surface of the first metal body 602 opposite to the die bond surface 12 on which the semiconductor element 1 is mounted is exposed.

Further, the semiconductor device 600 includes the signal leads 21, 23, 24, 26 which are the third metal bodies forming the ground terminals of the semiconductor device 600. The third metal bodies are provided with the protrusions 611, and the first metal body 602 is provided with the protrusions 603. The third metal bodies are held by the molding resin 2 in a state in which the protrusions 603 and the protrusions 611 are in contact with and conductive to each other.

The protrusions 611 provided to the third metal bodies and the protrusions 603 provided to the first metal body are bumps.

With the above structure, as in the semiconductor device 100 shown in embodiment 1, the semiconductor device 600 provides an effect that heat HF generated in the semiconductor element 1 can be efficiently dissipated. In addition, even in the case where a plurality of semiconductor devices 600 are arranged closely to each other, an effect of inhibiting oscillation due to coupling between the semiconductor devices 600 and deterioration of propagation property at a high frequency, is provided. Further, an effect that power supplied from the outside of the semiconductor device 600 can be efficiently propagated to the semiconductor element 1 and power amplified by the semiconductor element 1 is efficiently propagated to the outside, is provided.

In the case where arrangement of the ground terminals of the semiconductor device 600 is changed by substrate layout change or the like, in embodiment 1, etc., it is necessary to create again molds to be used for manufacturing the lead frames in each time and manufacture again the lead frames using the changed molds. However, in embodiment 6, it is possible to change arrangement of the ground terminals by changing the positions of the protrusions 603 and the protrusions 611, without manufacturing the lead frames again, thus providing an effect that arrangement of the ground terminals can be changed immediately and flexibly.

The number of the signal leads included in the lead frame 610 exemplified in embodiment 6 is six. However, as a matter of course, the lead frame 610 may be formed so as to include multiple signal leads whose number is more than six, in advance, and the signal leads to be used for the ground terminals may be selected as appropriate.

Embodiment 7

In the case where a plurality of the semiconductor devices described in embodiments 1 to 6 are surface-mounted on one surface of the substrate 73, the heat dissipation surfaces 13 of the plurality of semiconductor devices might not be on the same plane, because of warp or distortion of the substrate 73, manufacturing tolerance of the outer shapes of the semiconductor devices, or the like. In addition, the flatness of the base surface of the heatsink depends on working accuracy. Therefore, when a single heatsink is brought into contact with the plurality of semiconductor devices, there is a possibility that some of the semiconductor devices are not in contact with the heatsink or have small contact areas therewith.

Variations in flatness among the heat dissipation surfaces can be absorbed to a certain extent by applying heat dissipation grease between the heatsink and the heat dissipation surfaces of the plurality of mounted semiconductor devices. However, if variations in flatness are increased, the thickness of the heat dissipation grease needs to be increased, thus causing a problem of increasing the thermal resistance and reducing heat dissipation performance.

Figure 19A:
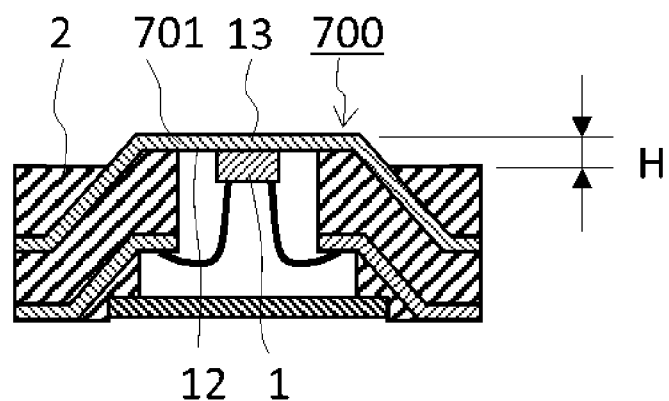
FIGS. 19A and 19B illustrate a semiconductor device according to embodiment 7 of the present invention.
Figure 19B:
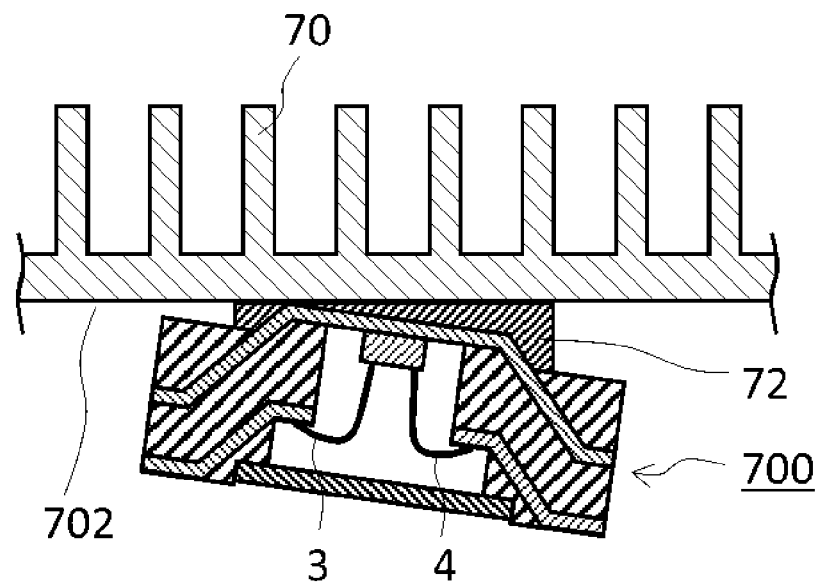

FIGS. 19A and 19B illustrate a semiconductor device 700 according to embodiment 7. Parts unnecessary for description are not shown, as appropriate. FIG. 19A is a sectional view of the semiconductor device 700. FIG. 19B is a sectional view showing a state in which the semiconductor device 700 and a heatsink 70 are in contact with each other when the heat dissipation surface 13 of the semiconductor device 700 and a base surface 702 of the heatsink 70 are not parallel to each other.

The semiconductor device 700 according to embodiment 7 of the present invention is different in the shape of the first metal body from the semiconductor device 100 according to embodiment 1, and a first metal body 701 protrudes from the molding resin 2 by a predetermined amount.

Specifically, in FIG. 19A, the semiconductor element 1 is mounted on the die bond surface 12 of the die pad portion 11 of the first metal body 701 forming the semiconductor device 700. The heat dissipation surface 13 which is a surface opposite to the die bond surface 12 is exposed by protruding from the molding resin 2 by a height H.

As shown in FIG. 19B, the heat dissipation surface 13 of the semiconductor device 700 protruding from the molding resin 2 is embedded in the heat dissipation grease 72 and comes into contact with the base surface 702 of the heatsink 70. Therefore, in embodiment 7, as compared to embodiment 1 in which the heat dissipation surface 13 does not protrude from the molding resin 2, even if the thickness of the heat dissipation grease 72 is thinned, the heat dissipation surface 13 and the base surface 702 of the heatsink 70 can be brought into contact with each other with the heat dissipation grease 72 interposed therebetween. Description of the other parts is omitted.

As described above, the semiconductor device 700 according to embodiment 7 of the present invention includes: the semiconductor element 1; the first metal body 701 having the die pad portion 11 to which the semiconductor element 1 is mounted, the semiconductor element 1 being mounted on the die bond surface 12 of the die pad portion 11; the second metal bodies 20 which have the wire bond pad portions 32 and 35 connected to the signal electrodes of the semiconductor element 1 via the wires 3 and 4, and are provided on the same side as the die bond surface 12 of the first metal body 701 on which the semiconductor element 1 is mounted, such that the second metal bodies 20 are separated from the first metal body 701 and covered by the first metal body 701, the second metal bodies 20 forming transmission lines together with the first metal body 701; and the molding resin 2 holding the first metal body 701 and the second metal bodies 20 such that the surface of the first metal body 701 opposite to the die bond surface 12 on which the semiconductor element 1 is mounted is exposed. The exposed surface of the first metal body 701 protrudes by a predetermined amount from the outer shape of the molding resin 2 of the semiconductor device 700.

With the above structure, as in the semiconductor device 100 shown in embodiment 1, the semiconductor device 700 provides an effect that heat HF generated in the semiconductor element 1 can be efficiently dissipated. In addition, even in the case where a plurality of semiconductor devices 700 are arranged closely to each other, an effect of inhibiting oscillation due to coupling between the semiconductor devices 700 and deterioration of propagation property at a high frequency, is provided. Further, an effect that power supplied from the outside of the semiconductor device 700 can be efficiently propagated to the semiconductor element 1 and power amplified by the semiconductor element 1 is efficiently propagated to the outside, is provided.

Further, the semiconductor device 700 according to embodiment 7 provides an effect of obtaining favorable heat dissipation even when the heat dissipation surface of the semiconductor device and the base surface of the heatsink are not parallel to each other.

As a protrusion amount H of the heat dissipation surface 13 increases, the lengths of the wires 3 and 4 connected to the semiconductor element 1 increase, so that propagation property at a high frequency of the semiconductor device 700 is deteriorated. In addition, as the thickness of the heat dissipation grease 72 is thinned, the thermal resistance is reduced and heat dissipation is increased, but variations in flatness cannot be absorbed. In general, the application thickness of the heat dissipation grease is at least about 50 micrometers. Therefore, it is desirable that the protrusion amount H of the heat dissipation surface 13 is 50 micrometers to 200 micrometers.

Embodiment 8

Embodiment 8 is one embodiment for solving the problem described in embodiment 7.

Figure 20A:
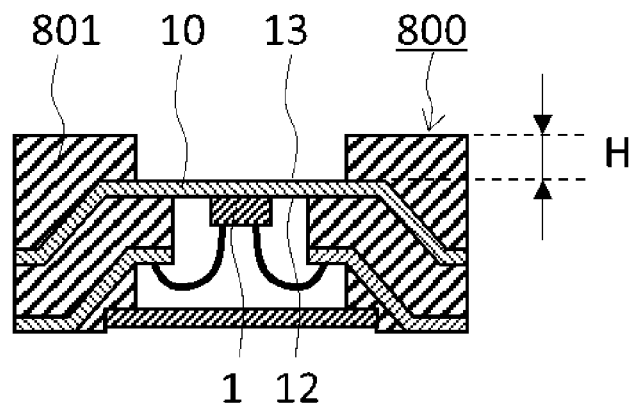
FIGS. 20A and 20B illustrate a semiconductor device according to embodiment 8 of the present invention.
Figure 20B:
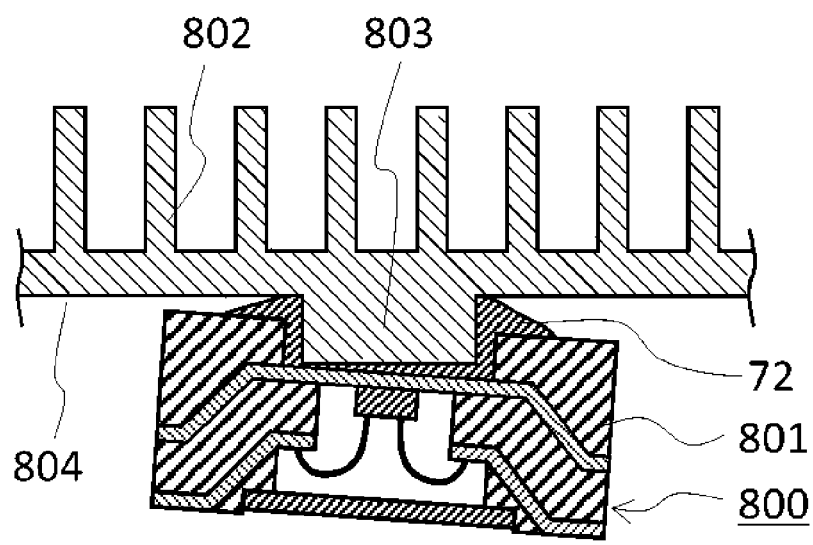

FIGS. 20A and 20B illustrate a semiconductor device 800 according to embodiment 8. Parts unnecessary for description are not shown, as appropriate. FIG. 20A is a sectional view of the semiconductor device 800. FIG. 20B is a sectional view showing a state in which the semiconductor device 800 and a heatsink 802 are in contact with each other when the heat dissipation surface 13 of the semiconductor device 800 and a base surface 804 of the heatsink 802 are not parallel to each other.

The semiconductor device 800 according to embodiment 8 of the present invention is different in the shape of a molding resin 801 from the semiconductor device 100 according to embodiment 1. Specifically, as shown in FIG. 20A, at the periphery of the heat dissipation surface 13 of the first metal body 10 forming the semiconductor device 800, the molding resin 801 protrudes by a height H from the heat dissipation surface 13.

As shown in FIG. 20B, the base surface 804 of the heatsink 802 is provided with a protrusion 803. The protrusion 803 is embedded in the heat dissipation grease 72 and comes into contact with the heat dissipation surface 13 of the semiconductor device 800.

Therefore, in embodiment 8, as compared to embodiment 1 in which the molding resin 801 does not protrude at the periphery of the heat dissipation surface 13, even if the thickness of the heat dissipation grease 72 is thinned, the heat dissipation surface 13 and the base surface 804 of the heatsink 802 can be brought into contact with each other with the heat dissipation grease 72 interposed therebetween. Description of the other parts is omitted.

As described above, the semiconductor device 800 according to embodiment 8 of the present invention includes: the semiconductor element 1; the first metal body 10 having the die pad portion 11 to which the semiconductor element 1 is mounted, the semiconductor element 1 being mounted on the die bond surface 12 of the die pad portion 11; the second metal bodies 20 which have the wire bond pad portions 32 and 35 connected to the signal electrodes of the semiconductor element 1 via the wires 3 and 4, and are provided on the same side as the die bond surface 12 of the first metal body 10 on which the semiconductor element 1 is mounted, such that the second metal bodies 20 are separated from the first metal body 10 and covered by the first metal body 10, the second metal bodies 20 forming transmission lines together with the first metal body 10; and the molding resin 801 holding the first metal body 10 and the second metal bodies 20 such that the surface of the first metal body 10 opposite to the die bond surface 12 on which the semiconductor element 1 is mounted is exposed. The outer shape of the molding resin 801 at the periphery of the exposed surface of the first metal body 10 protrudes by a predetermined amount from the exposed surface of the first metal body 10.

With the above structure, as in the semiconductor device 100 shown in embodiment 1, the semiconductor device 800 provides an effect that heat HF generated in the semiconductor element 1 can be efficiently dissipated. In addition, even in the case where a plurality of semiconductor devices 800 are arranged closely to each other, an effect of inhibiting oscillation due to coupling between the semiconductor devices 800 and deterioration of propagation property at a high frequency, is provided. Further, an effect that power supplied from the outside of the semiconductor device 800 can be efficiently propagated to the semiconductor element 1 and power amplified by the semiconductor element 1 is efficiently propagated to the outside, is provided.

Further, an effect of obtaining favorable heat dissipation even when the heat dissipation surface of the semiconductor device and the base surface of the heatsink are not parallel to each other, is provided. In addition, since the recess is provided, an effect of increasing the contact area between the semiconductor device 800 and the heat dissipation grease 72 is also provided.

As described above in embodiments 1 to 8, the semiconductor device according to the present invention is excellent in power transmission at a high frequency, and particularly suitable as a high-frequency semiconductor device.

The present invention is not limited to the embodiments described above, but includes various modifications. For example, the above embodiments are described in detail merely for the purpose of facilitating the understanding of the present invention, and the present invention is not necessarily limited to the configuration including all the features described above.

Features of one embodiment may be partially replaced with features of another embodiment, and features of one embodiment may be added to features of another embodiment. Features of each embodiment may be partially deleted or replaced with other features, or other features may be added thereto.

DESCRIPTION OF THE REFERENCE CHARACTERS 1 semiconductor element
100, 300, 400, 500, 600, 700, 800 semiconductor device
2, 801 molding resin
3, 4, 404, 504, 604 wire
10, 302, 402, 502, 602, 701 first metal body
11 die pad portion
12 die bond surface
13 heat dissipation surface
19, 29, 301, 310, 401, 410, 501, 601, 610 lead frame
20 second metal body
21, 22, 23, 24, 25, 26, 311, 312, 313, 314, 315,
316, 317, 318 signal lead (third metal body)
32, 35 wire bond pad portion
40, 73 substrate
70, 802 heatsink
74 antenna
91, 92, 93, 94, 95, 96 signal terminal
97 ground terminal
411, 503, 603, 611 protrusion

The invention claimed is:

1. A semiconductor device comprising:
a semiconductor element;
a first metal body having a die pad portion to which the semiconductor element is mounted, the semiconductor element being mounted on a die bond surface of the die pad portion;
a second metal body which has a wire bond pad portion connected to a signal electrode of the semiconductor element via a wire, and is provided on a same side as the die bond surface such that the second metal body is separated from the first metal body and covered by the first metal body, the second metal body forming a transmission line together with the first metal body; and
a molding resin holding the first metal body and the second metal body such that a surface of the first metal body opposite to the die bond surface is exposed, wherein
the exposed surface of the first metal body protrudes by a predetermined amount from an outer shape of the molding resin.

2. The semiconductor device according to claim 1, wherein
the molding resin holds the first metal body and the second metal body such that the die bond surface and the wire bond pad portion are exposed.

3. The semiconductor device according to claim 1, wherein
the transmission line is a microstrip line.

4. The semiconductor device according to claim 1, wherein
the transmission line is a grounded coplanar waveguide.

5. The semiconductor device according to claim 1, further comprising a third metal body forming a ground terminal, wherein
the third metal body is held by the molding resin, in a state of being conductive to the first metal body.

6. The semiconductor device according to claim 5, wherein
a protrusion provided to the third metal body is in contact with the first metal body.

7. The semiconductor device according to claim 5, wherein
the third metal body and a protrusion provided to the first metal body are in contact with each other.

8. The semiconductor device according to claim 5, wherein
a protrusion provided to the third metal body and a protrusion provided to the first metal body are in contact with each other.

9. The semiconductor device according to claim 8, wherein
the protrusion provided to the third metal body and the protrusion provided to the first metal body are bumps.

10. The semiconductor device according to claim 5, wherein
the third metal body and the first metal body are connected via a wire so as to be conductive to each other.

11. A semiconductor device comprising:
a semiconductor element;
a first metal body having a die pad portion to which the semiconductor element is mounted, the semiconductor element being mounted on a die bond surface of the die pad portion;
a second metal body which has a wire bond pad portion connected to a signal electrode of the semiconductor element via a wire, and is provided on a same side as the die bond surface such that the second metal body is separated from the first metal body and covered by the first metal body, the second metal body forming a transmission line together with the first metal body; and
a molding resin holding the first metal body and the second metal body such that a surface of the first metal body opposite to the die bond surface is exposed, wherein
an outer shape of the molding resin at a periphery of the exposed surface of the first metal body protrudes by a predetermined amount from the exposed surface of the first metal body.

12. An antenna device comprising:
the semiconductor device according to claim 1;
a substrate to which a plurality of the semiconductor devices are mounted; and
a plurality of antennas mounted on a surface of the substrate opposite to a surface thereof on which the plurality of semiconductor devices are mounted.

13. The semiconductor device according to claim 11, wherein
the molding resin holds the first metal body and the second metal body such that the die bond surface and the wire bond pad portion are exposed.

14. The semiconductor device according to claim 11, wherein
the transmission line is a microstrip line.

15. The semiconductor device according to claim 11, wherein
the transmission line is a grounded coplanar waveguide.

16. The semiconductor device according to claim 11, further comprising a third metal body forming a ground terminal, wherein
the third metal body is held by the molding resin, in a state of being conductive to the first metal body.

17. The semiconductor device according to claim 16, wherein
a protrusion provided to the third metal body is in contact with the first metal body.

18. The semiconductor device according to claim 16, wherein
the third metal body and a protrusion provided to the first metal body are in contact with each other.

19. The semiconductor device according to claim 16, wherein
a protrusion provided to the third metal body and a protrusion provided to the first metal body are in contact with each other.

20. The semiconductor device according to claim 19, wherein
the protrusion provided to the third metal body and the protrusion provided to the first metal body are bumps.

* * * * *